United States Patent
Yu et al.

(10) Patent No.: US 11,755,809 B2
(45) Date of Patent: Sep. 12, 2023

(54) INTEGRATED CIRCUIT INCLUDING ASYMMETRIC POWER LINE AND METHOD OF DESIGNING THE SAME

(71) Applicant: SAMSUNG ELECTRONICS CO., LTD., Suwon-si (KR)

(72) Inventors: Jisu Yu, Seoul (KR); Jaewoo Seo, Seoul (KR); Hyeongyu You, Hwaseong-si (KR); Sanghoon Baek, Seoul (KR); Jonghoon Jung, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 170 days.

(21) Appl. No.: 17/458,948

(22) Filed: Aug. 27, 2021

(65) Prior Publication Data
US 2022/0114320 A1    Apr. 14, 2022

(30) Foreign Application Priority Data

Oct. 13, 2020    (KR) .......................... 10-2020-0131812

(51) Int. Cl.
*G06F 30/00*    (2020.01)
*G06F 30/392*    (2020.01)
(Continued)

(52) U.S. Cl.
CPC ............ *G06F 30/392* (2020.01); *H01L 23/50* (2013.01); *H01L 27/0207* (2013.01)

(58) Field of Classification Search
CPC ... G06F 30/392; H01L 23/50; H01L 23/5286; H01L 23/485; H01L 27/0207; H01L 27/0886; H01L 2027/11874
See application file for complete search history.

(56) References Cited

U.S. PATENT DOCUMENTS 6,308,307 B1 * 10/2001 Cano ..................... G06F 30/394
716/120
6,831,483 B2 * 12/2004 Shimazaki ......... H03K 19/0016
326/27

(Continued)

FOREIGN PATENT DOCUMENTS

CN    109037215 A  *  12/2018  ....... H01L 21/76895
CN    114361154 A  *   4/2022  ........... G06F 30/392

(Continued)

*Primary Examiner* — Naum Levin
(74) *Attorney, Agent, or Firm* — Sughrue Mion, PLLC

(57) ABSTRACT

An integrated circuit is provided. The integrated circuit includes a first cell that has a first height and is arranged in a first row which extends in a first direction; a second cell that has a second height and is arranged in a second row which extends in the first direction and is adjacent to the first row, wherein the second cell is adjacent to the first cell in a second direction perpendicular to the first direction; and a power line that extends in the first direction, is arranged on a boundary between the first cell and the second cell, and is configured to supply power to the first cell and the second cell. The first cell overlaps a first width of the power line along the second direction and the second cell overlaps a second width of the power line along the second direction, and the first width and the second width are different from each other.

20 Claims, 19 Drawing Sheets

(51) Int. Cl.
  *H01L 23/50* (2006.01)
  *H01L 27/02* (2006.01)

(56) References Cited

U.S. PATENT DOCUMENTS

| | | | |
|---|---|---|---|
| 7,800,409 B2 | 9/2010 | Pitts | |
| 8,513,978 B2 * | 8/2013 | Sherlekar | G06F 30/394 |
| | | | 716/55 |
| 8,631,377 B2 | 1/2014 | Lee et al. | |
| 8,878,303 B2 | 11/2014 | Hatamian et al. | |
| 9,007,095 B2 | 4/2015 | Penzes | |
| 9,449,136 B2 | 9/2016 | Pan et al. | |
| 10,147,714 B2 * | 12/2018 | Wang | H01L 23/5286 |
| 10,990,740 B2 * | 4/2021 | Kim | G06F 30/392 |
| 11,062,067 B2 * | 7/2021 | Hills | G06F 30/367 |
| 11,101,267 B2 * | 8/2021 | Lim | H01L 29/0607 |
| 11,393,819 B2 * | 7/2022 | Li | H01L 23/5286 |
| 11,410,988 B2 * | 8/2022 | Lee | H01L 21/823821 |
| 2017/0116365 A1 | 4/2017 | Cheng et al. | |
| 2018/0358345 A1 * | 12/2018 | Qian | H01L 27/0207 |
| 2019/0148407 A1 | 5/2019 | Guo et al. | |
| 2019/0164949 A1 | 5/2019 | Sio et al. | |
| 2020/0019667 A1 | 1/2020 | Lin et al. | |
| 2020/0402968 A1 * | 12/2020 | Zhuang | H01L 23/5286 |
| 2021/0118798 A1 * | 4/2021 | Liebmann | H01L 21/76895 |
| 2021/0224456 A1 * | 7/2021 | Chen | G06F 30/392 |
| 2021/0375851 A1 * | 12/2021 | Peng | H01L 27/092 |
| 2022/0037254 A1 * | 2/2022 | Choi | H01L 27/0207 |
| 2022/0059571 A1 * | 2/2022 | Baek | H01L 23/481 |

FOREIGN PATENT DOCUMENTS

| | | | | |
|---|---|---|---|---|
| JP | 2017123353 A | * | 7/2017 | ......... H01L 23/5286 |
| KR | 20190132089 A | * | 11/2019 | |
| KR | 20220015207 A | * | 2/2022 | |
| TW | 202009598 A | * | 3/2020 | ........... G06F 30/392 |
| TW | I787512 B | * | 12/2022 | |

* cited by examiner

INTEGRATED CIRCUIT INCLUDING ASYMMETRIC POWER LINE AND METHOD OF DESIGNING THE SAME

CROSS-REFERENCE TO RELATED APPLICATION

This application claims priority from Korean Patent Application No. 10-2020-0131812, filed on Oct. 13, 2020, in the Korean Intellectual Property Office, the disclosure of which is herein incorporated by reference in its entirety.

BACKGROUND

Methods, apparatuses and systems consistent with example embodiments relate to an integrated circuit, and more particularly, to an integrated circuit including an asymmetric power line and a method of designing the same.

An integrated circuit may include a plurality of cells arranged along a plurality of rows. The integrated circuit may include cells providing a same function, cells providing different functions, or cells providing a same function with different characteristics. For example, among a plurality of cells performing a same function, a cell selected based on a characteristic, such as an operation speed, power consumption, the area, or the like, may be included in the integrated circuit. Also, the integrated circuit may include single height cells arranged in one row or multiple height cells arranged continuously in two or more rows.

SUMMARY

Example embodiments provide an integrated circuit including a plurality of cells, an integrated circuit including an asymmetric power line and a method of designing the same.

According to an aspect of an example embodiment, an integrated circuit includes: a first cell that has a first height and is arranged in a first row which extends in a first direction; a second cell that has a second height and is arranged in a second row which extends in the first direction and is adjacent to the first row, wherein the second cell is adjacent to the first cell in a second direction perpendicular to the first direction; and a power line that extends in the first direction, is arranged on a boundary between the first cell and the second cell, and is configured to supply power to the first cell and the second cell. The first cell overlaps a first width of the power line along the second direction and the second cell overlaps a second width of the power line along the second direction, and the first width and the second width are different from each other.

According to an aspect of an example embodiment, an integrated circuit includes: a first cell that is arranged on a first row, wherein the first row extends in a first direction and has a first height; a second cell that is arranged on a second row, wherein the second row is adjacent to the first row and has the first height; a third cell that is arranged on a third row, wherein the third row is adjacent to the second row and has a second height; a first power line arranged on a first boundary where the first row and the second row contact each other, wherein the first power line is configured to provide power to the first cell and the second cell; and a second power line arranged on a second boundary where the second row and the third row contact each other, wherein the second power line is configured to provide power to the second cell and the third cell. The first power line is symmetric based on the first boundary, and the second power line is asymmetric based on the second boundary.

According to an aspect of an example embodiment, a method of designing an integrated circuit includes: arranging a plurality of first cells from a cell library on a plurality of first rows based on input data of defining the integrated circuit, wherein the plurality of first rows extend in a first direction and have a first height; arranging a plurality of second cells from the cell library on a plurality of second rows based on the input data, wherein the plurality of second rows extend in the first direction and have a second height; arranging a first power line having an asymmetric width with respect to a first boundary between the plurality of first rows and the plurality of second rows; and generating output data defining a layout of the integrated circuit.

According to an aspect of an example embodiment, an integrated circuit includes: a first cell region including a plurality of first cells, each of which has a first height, wherein the plurality of first cells are arranged on L first rows adjacent to each other, and L is a natural number; a second cell region adjacent to the first cell region and including a plurality of second cells, each of which has a second height, wherein the plurality of second cells are arranged on M second rows adjacent to each other, and M is a natural number; a third cell region adjacent to the second cell region and including a plurality of third cells, each of which has a third height, wherein the plurality of third cells are arranged on N third rows adjacent to each other, and N is a natural number; first power lines arranged on a first boundary between two of the first rows, a second boundary between two of the second rows, and a third boundary between two of the third rows, wherein the first power lines are configured to provide a supply voltage to any one or any combination of the plurality of first cells, the plurality of second cells and the plurality of third cells; and second power lines arranged on a fourth boundary between the first cell region and the second cell region and a fifth boundary between the second cell region and the third cell region, wherein the second power lines are configured to provide the supply voltage to any one or any combination of the plurality of first cells, the plurality of second cells and the plurality of third cells. Widths of the first power lines are symmetric with respect to a corresponding boundary, and widths of the second power lines are asymmetric with respect to a corresponding boundary.

BRIEF DESCRIPTION OF THE DRAWINGS

The above, and other aspects, features and advantages will be more clearly understood from the following detailed description of example embodiments, taken in conjunction with the accompanying drawings in which.

DETAILED DESCRIPTION

Hereinafter, example embodiments will be described with reference to accompanying drawings.

Figure 1:
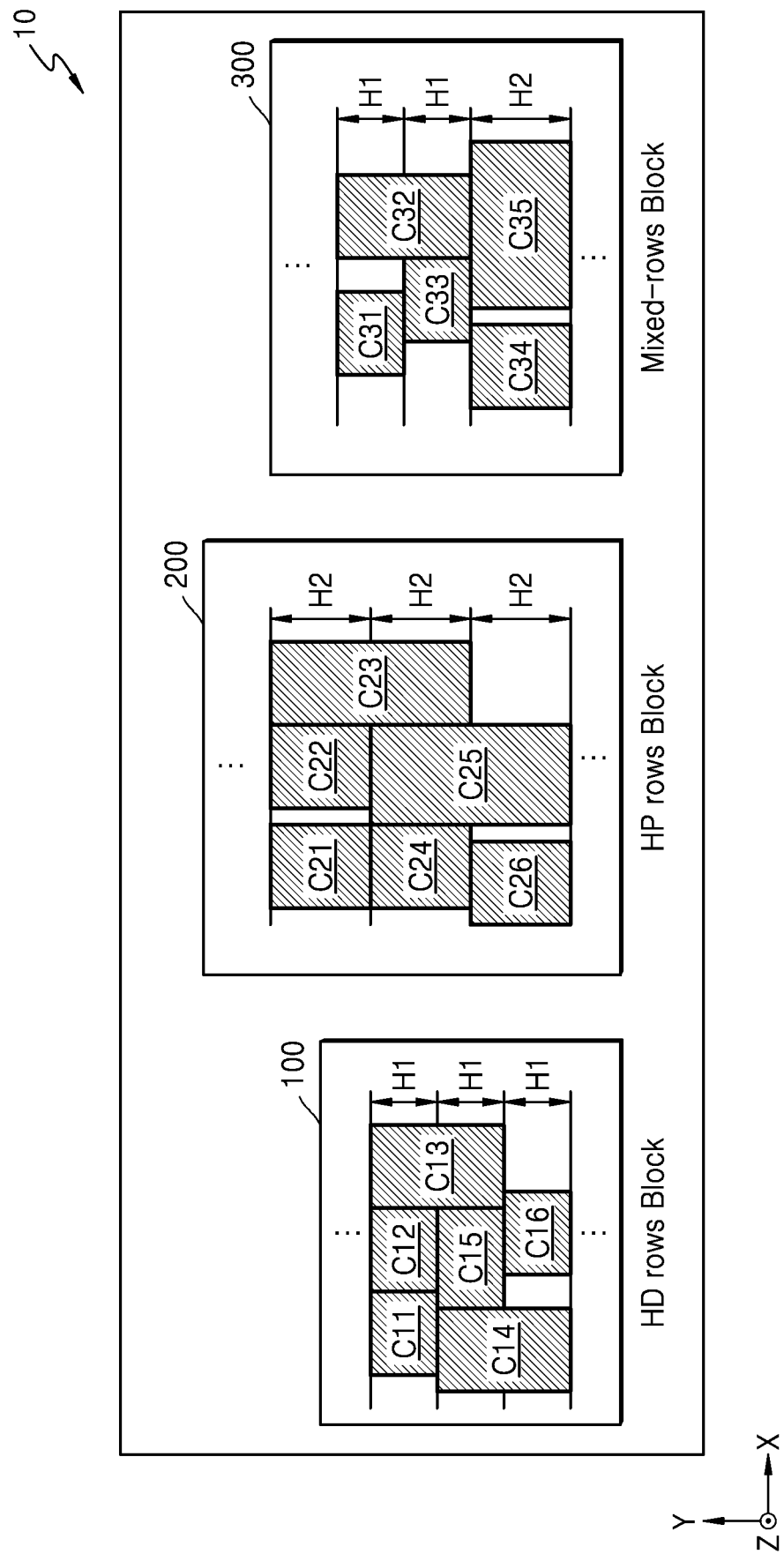
FIG. 1 is a view for describing an integrated circuit including a mixed-rows block, according to an example embodiment.

FIG. 1 is a view for describing an integrated circuit 10 according to an example embodiment. FIG. 1 is a plan view showing the integrated circuit 10 including a plurality of blocks on a plane extending along an X-axis and a Y-axis. An X-axis direction and a Y-axis direction may be respectively referred to as a first horizontal direction and a second horizontal direction. A Z-axis direction may be perpendicular to the X-axis direction and the Y-axis direction, and may be referred to as a vertical direction. The plane extending along the X-axis and the Y-axis may be referred to as a horizontal plane, a component arranged on a +Z-axis direction relatively to another component may be referred to as being above the other component, and a component arranged in a −Z-axis direction relatively to another component may be referred to as being below the other component. Also, the area of a component may refer to the size occupied by the component in a plane parallel to the horizontal plane, and the height of a component may refer to the length of the component in the Y-axis direction.

The integrated circuit 10 may include a high density (HD) rows block 100, a high performance (HP) rows block 200, and a mixed-rows block 300. Each block may include a plurality of cells. A cell is a unit of a layout included in an integrated circuit, may be designed to perform a pre-defined function, and may be referred to as a standard cell. The integrated circuit may include a plurality of various cells, and the cells may be aligned along a plurality of rows. The HD rows block 100 may include a plurality of standard cells C11 through C16 arranged in rows having a height H1. The HP rows block 200 may include a plurality of standard cells C21 through C26 arranged in rows having a height H2. The mixed-rows block 300 may include a plurality of standard cells C31 through C35 arranged in rows having the height H1 and rows having the height H2. The height H2 may be greater than the height H1. A cell arranged in one row, such as C11, C21, and C31, may be referred to as a single height cell, and a cell continuously arranged in two or more mutually adjacent rows, such as C13, C14, and C23, may be referred to as a multiple height cell. Standard cells arranged in the rows having the height H2 may be referred to as HP cells, and standard cells arranged in the rows having the height H1 may be referred to as HD cells. The HP cell provides higher performance than the HD cell, but may have greater power consumption and greater size. The HD cell consumes less power and has smaller size than the HP cell, but may provide lower performance. Accordingly, the HP rows block 200 may be used while designing an integrated circuit in which performance is important, and the HD rows block 100 may be used while designing an integrated circuit in which power consumption is important.

To design a block that provides higher performance than the HD rows block 100 and consumes less power than the HP rows block 200, rows having a height H3 greater than the height H1 and less than the height H2 may be used (H2>H3>H1). In this case, because standard cells having the height H3 need to be newly designed, a lot of cost may be required for design.

The mixed-rows block 300 may be used to optimize performance and integration. The mixed-rows block 300 may include HD rows having the height H1 and HP rows having the height H2. By adjusting a ratio of the HD rows and the HP rows included in the mixed-rows block 300, the performance and integration may be optimized. Also, because it is possible to use the HD cell and the HP cell, which have been previously designed, cost required to design a standard cell may be significantly reduced.

Figure 2A:
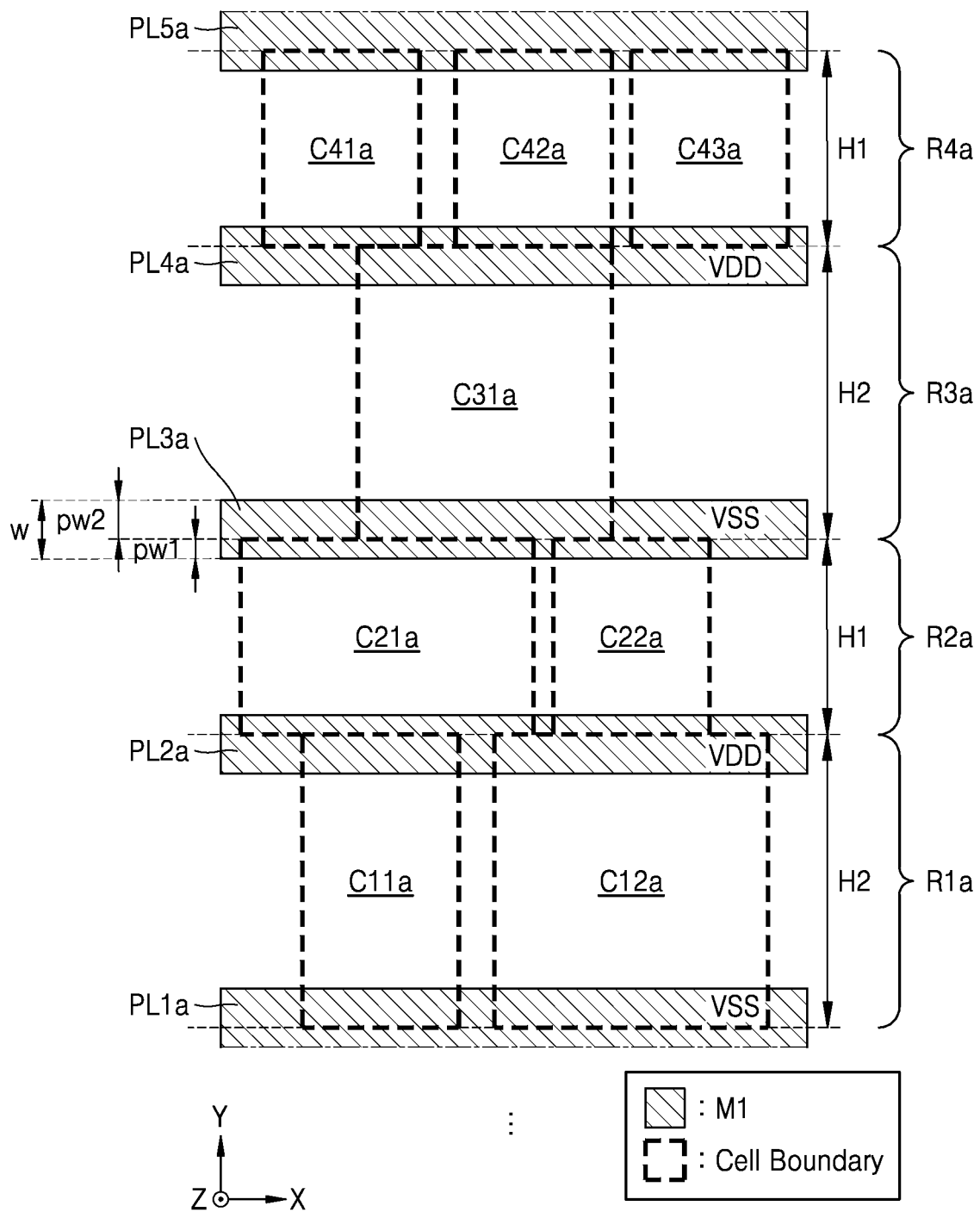
FIG. 2A is a view schematically showing a part of an integrated circuit, according to an example embodiment.

FIG. 2A is a view schematically showing a part of an integrated circuit 10*a*, according to an example embodiment. FIG. 2A is a plan view showing the integrated circuit 10*a* including a mixed-rows block on a plane extending along an X-axis and a Y-axis. The integrated circuit 10*a* may include a plurality of cells C11*a* through C43*a*. The plurality of cells C11*a* through C43*a* may be respectively arranged in a plurality of first through fourth rows R1*a* through R4*a* extending in an X-axis direction. The integrated circuit 10*a* may include a multiple height cell, but for convenience of description, only single height cells will be described. Referring to FIG. 2A, the integrated circuit 10*a* may include a plurality of HP cells, i.e., the cells C11*a*, C12*a*, and C31*a*, and a plurality of HD cells, i.e., the cells C21*a*, C22*a*, C41*a*, C42*a*, and C43*a*. The plurality of cells C11*a* through C43*a* may be arranged on the plurality of first through fourth rows R1*a* through R4*a*. The first and third rows R1*a* and R3*a* may be HP rows having a height H2, and the second and fourth rows R2*a* and R4*a* may be HD rows having a height H1. In other words, in the integrated circuit 10*a* according to an example embodiment, a ratio of the HP rows to the HD rows may be 1:1. Accordingly, one HP row and one HD row may be alternately arranged. However, example embodiments are not limited thereto, and the ratio of the HP rows to the HD rows may be set considering the area, performance, and power consumption of the integrated circuit 10*a*. For example, M HP rows and N HD rows may be alternately arranged, wherein M and N are each a natural number.

Conductive patterns (i.e., power lines) to which a positive supply voltage VDD and a negative supply voltage VSS (or a ground voltage) are respectively applied in a row boundary may extend in the X-axis direction. For example, a second power line PL2*a* to which the positive supply voltage VDD is applied in a row boundary of the first row R1*a* and the second row R2*a* may extend in the X-axis direction. Each of a plurality of first through fifth power lines PL1*a* through PL5*a* may provide the positive supply voltage VDD or negative supply voltage VSS to the plurality of cells C11*a* through C43*a*. For example, the second power line PL2*a* may provide the positive supply voltage VDD to the cells C11*a*, C12*a*, C21*a*, and C22*a*.

The widths of the first through fifth power lines PL1a through PL5a may be asymmetric based on a row boundary. For example, the third power line PL3a may have an asymmetric width based on a row boundary of the second row R2a and the third row R3a. A power line may be divided into partial power lines based on a row boundary. The partial power lines may have different (i.e., asymmetric) widths. In particular, the power line may be divided into a partial power line in a first direction and a partial power line in a second direction, based on the row boundary. Here, the first direction may be a +Y-axis direction and the second direction may be a −Y-axis direction. For example, the third power line PL3a may be divided into a partial power line in the first direction and a partial power line in the second direction, based on a row boundary of the second row R2a and the third row R3a. The width of the partial power line may be proportional to the height of a row overlapping the partial power line. For example, because the height H2 of the second row R2a is greater than the height H1 of the first row R1a, the width pw2 of the partial power line in the first direction of the third power line PL3a may be greater than the width pw1 of the partial power line in the second direction thereof (pw2>pw1). According to an example embodiment, pw1/pw2, i.e., a ratio of the width pw1 of the partial power line in the second direction to the width pw2 of the partial power line in the first direction may be 0.3 to 0.85, but example embodiments are not limited thereto. The width of a power line may be a sum of the widths of partial power lines. For example, the width w of the third power line PL3a may be a sum of the width pw1 and the width pw2 (w=pw1+pw2). Like the third power line PL3a, the widths of the second power line PL2a and the fourth power line PL4a may also be the width w. For convenience of description, a power line having an asymmetric width based on a row boundary has been described, but the width of the power line may be asymmetric based on a cell boundary. For example, the third power line PL3a may have an asymmetric width based on a boundary of the cell C21a and the cell C31a. Accordingly, the row boundary and the cell boundary may be interchangeably used.

An HP cell and an HD cell may have different design rules. In detail, a minimum spacing between wires included in the HP cell may be different from a minimum spacing between wires included in the HD cell. Accordingly, when a power line of a symmetric width is arranged on a row boundary based on the row boundary, the design rule may be violated in the HD cell. The integrated circuit 10a according to an example embodiment may prevent violation of the design rule by including a power line having an asymmetric width based on the row boundary.

Figure 2B:
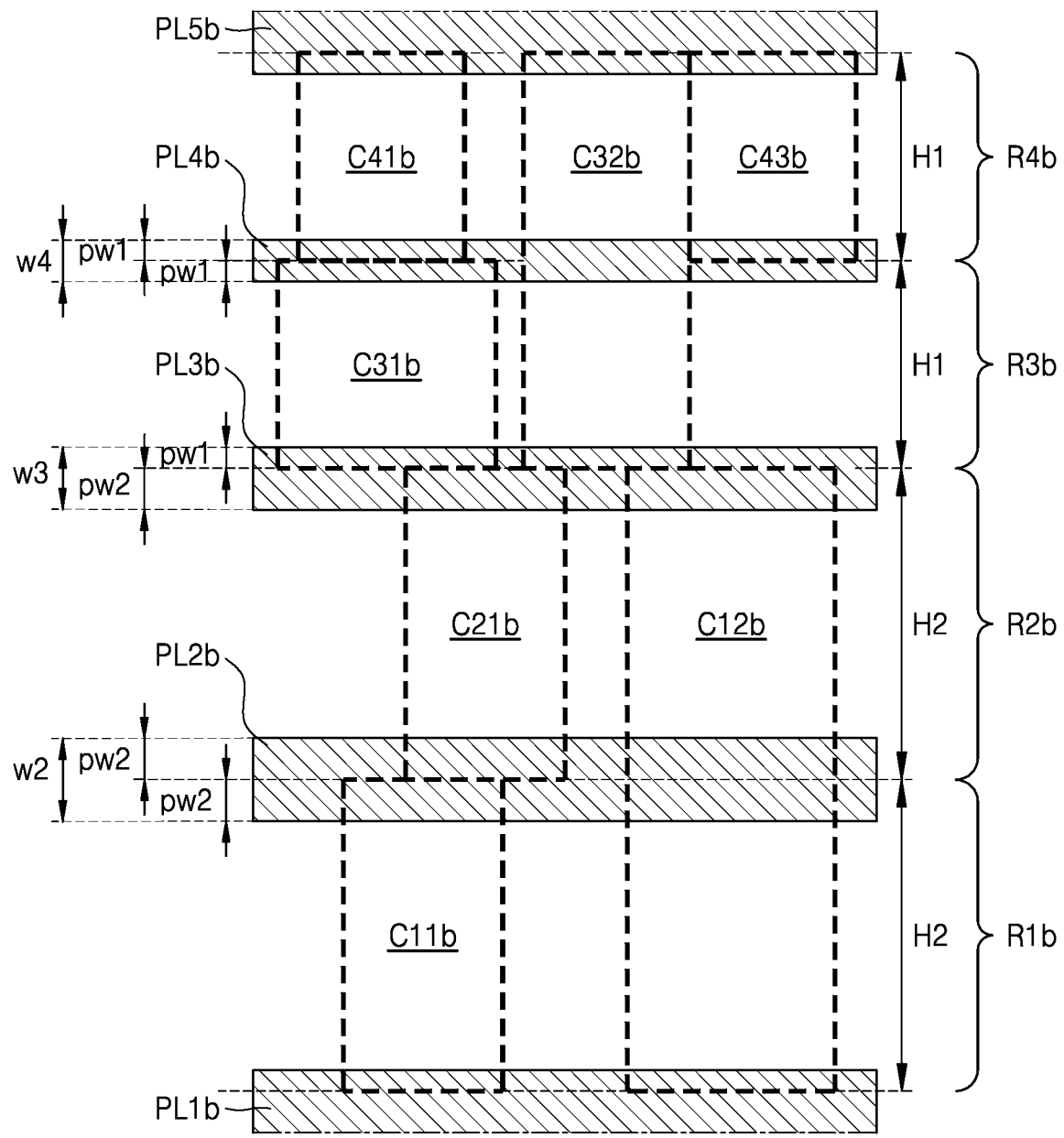
FIG. 2B is a view schematically showing a part of an integrated circuit, according to an example embodiment.

FIG. 2B is a view schematically showing a part of an integrated circuit 10b, according to an example embodiment. FIG. 2B is a plan view showing the integrated circuit 10b including a mixed-rows block on a plane extending along an X-axis and a Y-axis. The integrated circuit 10b may include a plurality of cells C11b through C43b. Referring to FIG. 2B, the integrated circuit 10b may include a plurality of HP cells, i.e., the cells C11b, C12b, and C21b, and a plurality of HD cells, i.e., the cells C31b, C32b, C41b, C42b, and C43b. The plurality of cells C11b through C43b may be arranged on the plurality of first through fourth rows R1b through R4b. Some cells, such as C11b, C21b, C31b, C41b, and C43b, may be single height cells and arranged on one row. Some cells, such as C12b and C32b, may be multiple height cells and arranged over a plurality of rows. The first and second rows R1b and R2b may be HP rows having a height H2, and the third and fourth rows R3b and R4b may be HD rows having a height H1. In other words, in the integrated circuit 10b according to an example embodiment, a ratio of the HP rows to the HD rows may be 2:2. Accordingly, two HP rows and two HD rows may be alternately arranged. However, example embodiments are not limited thereto, and the ratio of the HP rows to the HD rows may be set considering the area, performance, and power consumption of the integrated circuit 10a. For example, M HP rows and N HD rows may be alternately arranged, wherein M and N are each a natural number. The cell C12b may be an HP cell having the height twice the height H2 and arranged over HP rows. The cell C32b may be an HD cell having the height twice the height H1 and arranged over HD rows. Example embodiments will be described in FIGS. 4A, 4B, 4C, 4D, 5, 6A, 6B and 7 through 9 based on an HD cell and an HP cell, which are single height cells, but example embodiments may also be applied to an HD cell and an HP cell, which are multiple height cells.

Each of a plurality of first through fifth power lines PL1b through PL5b may provide a positive supply voltage VDD or negative supply voltage VSS to the plurality of cells C11b through C43b. For example, the second power line PL2b may provide the positive supply voltage VDD to the cells C11b, C12b, and C21b.

The integrated circuit 10b according to an example embodiment may include power lines having different widths. For example, the second power line PL2b may have the width w2, the third power line PL3b may have the width w3, and the fourth power line PL4b may have the width w4. The second power line PL2b is arranged on a boundary of adjacent HP rows, and thus, the width of a partial power line in a first direction and the width of a partial power line in a second direction may both be width pw2. Accordingly, the width w2 of the second power line PL2b may be twice the width pw2 (w2=pw2+pw2). The third power line PL3b is arranged on a boundary of an HP row and an HD row, and thus, the width of a partial power line in the first direction may be a width pw1 and the width of a partial power line in the second direction may be the width pw2. Accordingly, the width w3 of the third power line PL3b may be a sum of the width pw1 and the width pw2 (w3=pw1+pw2). The fourth power line PL4b is arranged on a boundary of adjacent HD rows, and thus, the width of a partial power line in the first direction and the width of a partial power line in the second direction may both be the width pw1. Accordingly, the width w4 of the fourth power line PL4b may be twice the width pw1 (w4=pw1+pw1).

When asymmetric power is supplied to cells having the same height and adjacent in a Y-axis direction, expected performance may not be provided. The integrated circuit 10b according to an example embodiment includes not only a power line having an asymmetric width based on a row boundary, but also a power line having a symmetric width, thereby providing a block matching expected performance while an integrated circuit is designed.

Figure 3:
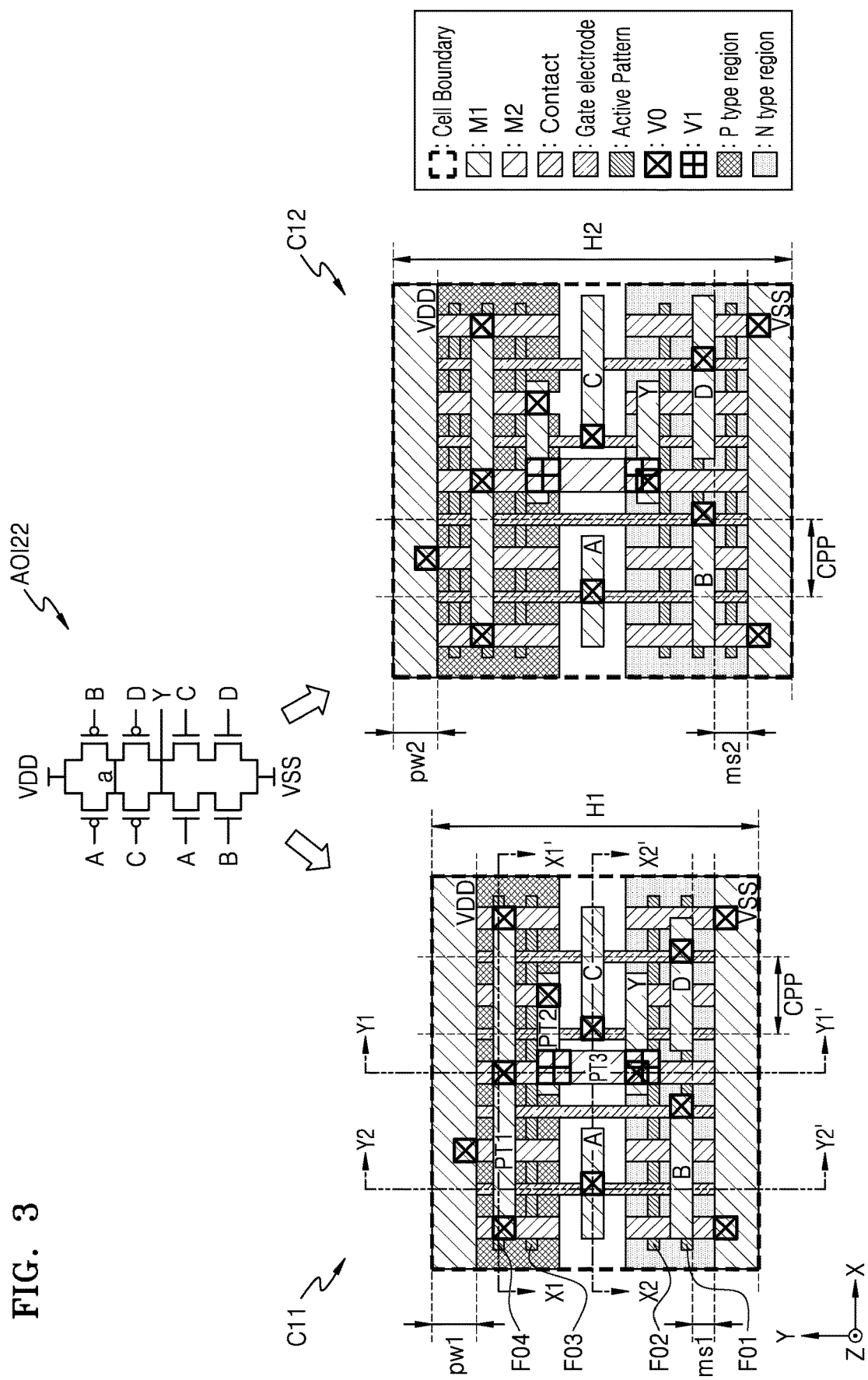
FIG. 3 is a view showing examples of cells according to an example embodiment.

FIG. 3 is a view showing examples of first and second cells C11 and C12 according to an example embodiment. In particular, an upper portion of FIG. 3 illustrates a circuit diagram of a 2-2 AND-OR-inverter (AOI22) and a lower portion of FIG. 3 illustrates layouts of the first and second cells C11 and C12 corresponding to the AOI22, on a plane extending along an X-axis and a Y-axis. In the drawings, only some layers are shown for convenience of illustration, and a via may be illustrated even though the via is located under a pattern of a wiring layer to indicate a connection between a pattern of the wiring layer and a lower pattern.

As shown in FIG. 3, at least one active pattern may extend in an X-axis direction in an active region and the active pattern may form a transistor by crossing a gate electrode extending in a Y-axis direction. When the active pattern in a form of a fin extends in the X-axis direction, the transistor formed by the active pattern and the gate electrode may be referred to as a fin field effect transistor (FinFET). As will be described below with reference to FIGS. 4A, 4B, 4C and 4D, example embodiments will be described mainly referring to cells including a FinFET, but it will be understood that example embodiments may also be applied to cells including a transistor of a structure different from a FinFET. For example, the active pattern may include a plurality of nanosheets extending in the X-axis direction and apart from each other in a Z-axis direction, and the cell may include a multi-bridge channel FET (MBCFET) formed by the plurality of nanosheets with the gate electrode. Also, the cell may include a ForkFET having a structure in which nanosheets for a P-type transistor and nanosheets for an N-type transistor are separated from each other by a dielectric wall and thus the N-type transistor and the P-type transistor are closer. Also, the cell may include a vertical FET (VFET) having a structure in which source and drain regions are apart from each other in the Z-axis direction with a channel region therebetween and the gate electrode surrounds the channel region. Also, the cell may include an FET such as a complementary FET (CFET), a negative FET (NCFET), or a carbon nanotube (CNT) FET, and may include a bipolar junction transistor or another 3-dimensional (3D) transistor.

Referring to FIG. 3, the AOI22 may have first through fourth inputs (input pins A through D) and an output (an output pin Y). The AOI22 may include four N-type FETs (NFETs) and four P-type FETs (PFETs). According to a function of the AOI22, when a logic low signal is input to at least one of the input pin A and the input pin B, and a logic low signal is input to at least one of the input pin C and the input pin D, a logic high signal may be output to the output pin Y. The first and second cells C11 and C12 provide a same function while having different areas or performances. For example, the second cell C12 may have a greater area than the first cell C11, but compared to the first cell C11, may provide improved performance. In other words, the first cell C11 may be an HD cell having a relatively small area and the second cell C12 may be an HP cell providing relatively high performance. As shown in FIG. 3, the first cell C11 (the HD cell) may have a height H1 in the Y-axis direction, and the second cell C12 (the HP cell) may have a height H2 greater than the height H1 in the Y-axis direction. Accordingly, the first cell C11 may be arranged on rows having the height H1 and the second cell C12 may be arranged on rows having the height H2. As shown in FIG. 3, a pitch CPP of gate electrodes included in the first cell C11 may be the same as a pitch CPP of gate electrodes included in the second cell C12. Accordingly, the first cell C11 and the second cell C12 may be each arranged on rows having different heights while the gate electrodes of the first cell C11 and the gate electrodes of the second cell C12 may be aligned in the Y-axis direction.

Design rules required by an HP cell and an HD cell may be different from each other. For example, a minimum spacing between conductive patterns arranged on a first wiring layer M1 in the first cell C11 may be a first minimum spacing ms1, and a minimum spacing between conductive patterns arranged on the first wiring layer M1 in the second cell C12 may be a second minimum spacing ms2. The second minimum spacing ms2 may be greater than the first minimum spacing ms1. When a width of a power line is symmetric based on a cell boundary, a distance between a power line and a conductive pattern most adjacent to the power line among conductive patterns included in an HD cell may be less than the first minimum spacing ms1. Accordingly, when a power line of a symmetric width is arranged on a row boundary based on a cell boundary, the design rule may be violated in the HD cell. The first and second cells C11 and C22 according to an example embodiment may prevent violation of the design rule by including a power line having an asymmetric width according to a cell height.

Figure 4A:
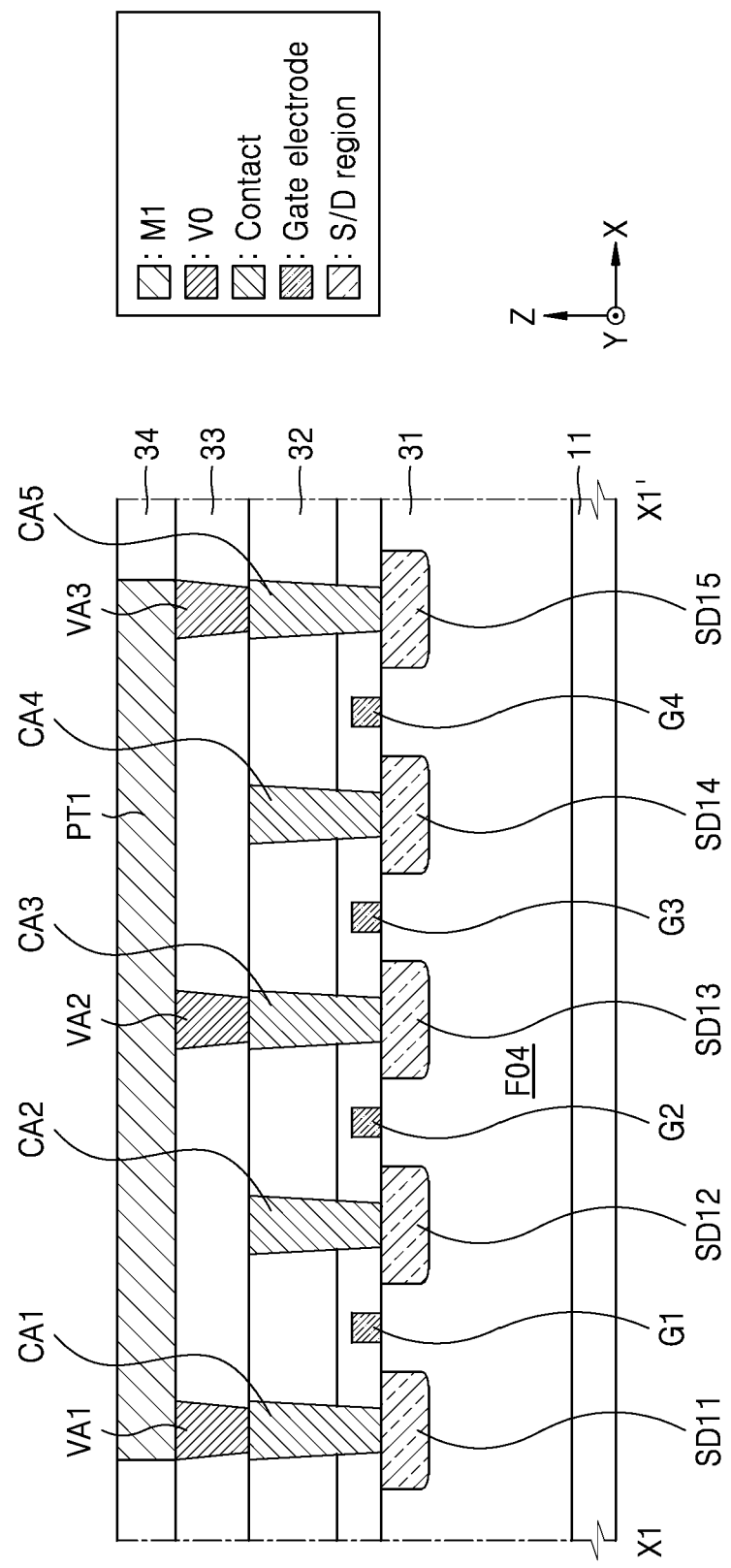
FIGS. 4A, 4B, 4C and 4D are cross-sectional views showing examples of structures of a cell, according to an example embodiment.
Figure 4B:
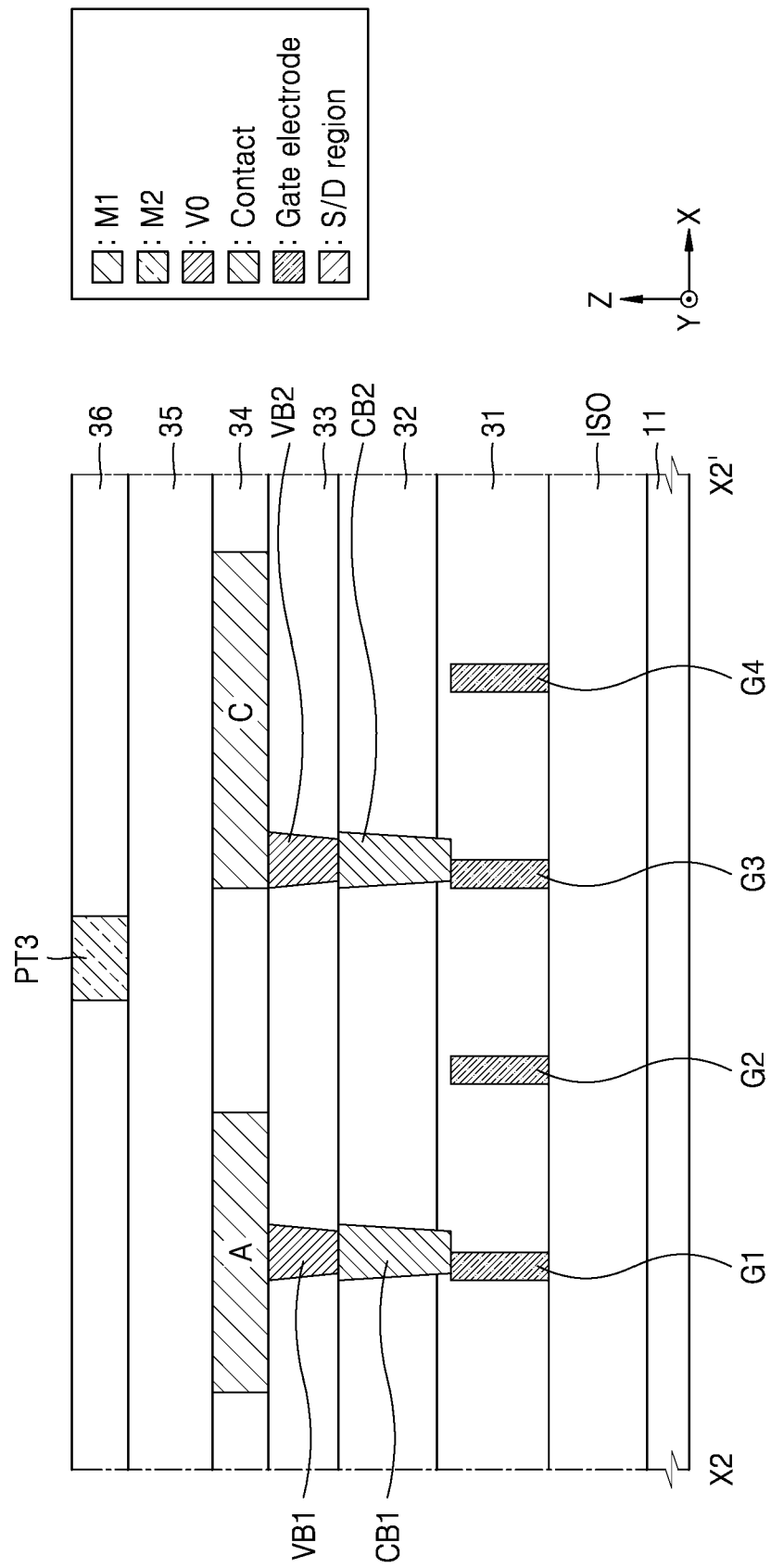
Figure 4C:
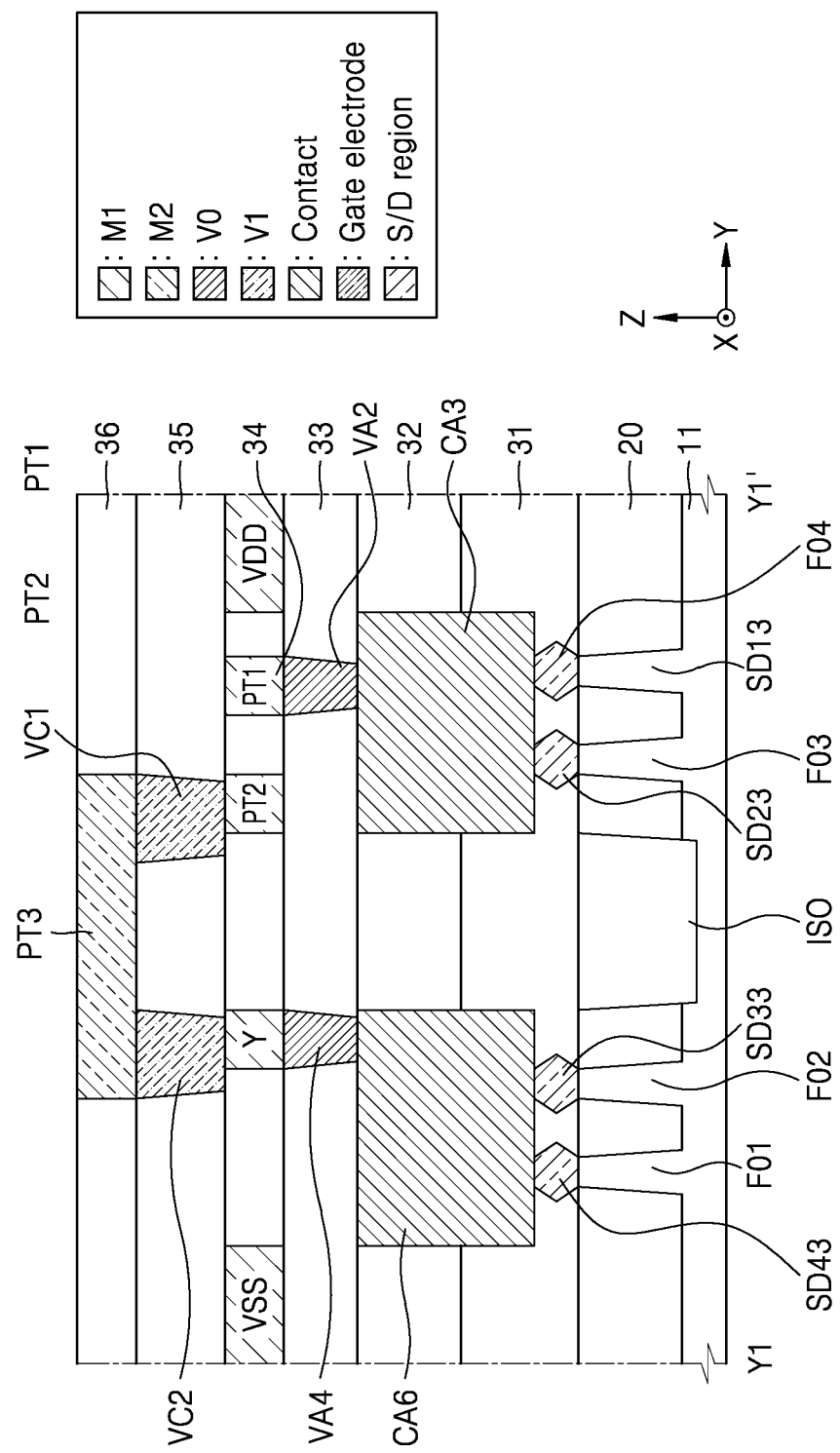
Figure 4D:
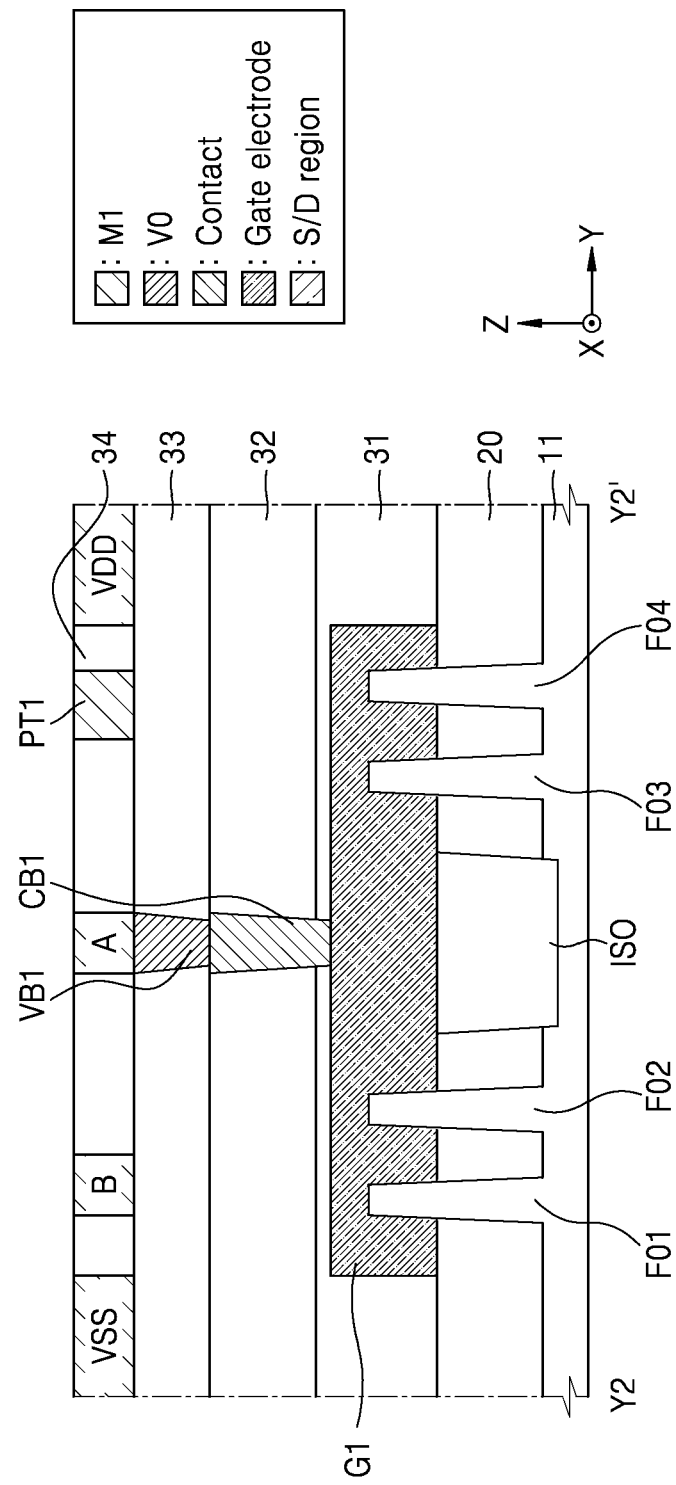

FIGS. 4A, 4B, 4C and 4D are cross-sectional views showing examples of structures of the first cell C11, according to an example embodiment. In detail, FIG. 4A is the cross-sectional view of the first cell C11 taken along a line X1-X1' of FIG. 3, FIG. 4B is the cross-sectional view of the first cell C11 taken along a line X2-X2' of FIG. 3, FIG. 4C is the cross-sectional view of the first cell C11 taken along a line Y1-Y1' of FIG. 3, and FIG. 4D is the cross-sectional view of the first cell C11 taken along a line Y2-Y2' of FIG. 3. A gate spacer may be formed on a side surface of the gate electrode and a gate dielectric layer may be formed between the gate electrode and the gate spacer and on a lower surface of the gate electrode. Also, a barrier layer may be formed on a surface of a contact and/or a via. Hereinafter, FIGS. 4A, 4B, 4C and 4D will be described with reference to FIG. 3, and redundant descriptions of FIGS. 4A, 4B, 4C and 4D may be omitted.

Referring to FIG. 4A, a substrate 11 may be bulk silicon or silicon-on-chip (SOI), and as a non-limiting example, may include silicon germanium (SiGe), silicon germanium on insulator (SGOI), indium antimonide (InSb), lead tellurium (PbTe) compound, indium arsenide (InAs), phosphide, gallium arsenide (GaAs), or gallium antimonide (GaSb). A fourth fin F04 may extend in the X-axis direction on the substrate 11, and first through fifth source/drain regions SD11 through SD15 may be formed in the fourth fin F04. First through fourth interlayer insulating layers 31 through 34 may be formed on the fourth fin F04. The first and second source/drain regions SD11 and SD12 may form a transistor, i.e., a PFET, with a first gate electrode G1, the second and third source/drain regions SD12 and SD13 may form a PFET with a second gate electrode G2, the third and fourth source/drain regions SD13 and SD14 may form a PFET with a third gate electrode G3, and the fourth and fifth source/drain regions SD14 and SD15 may form a PFET with a fourth gate electrode G4.

First through fifth source/drain contacts CA1 through CA5 may be respectively connected to the first through fifth source/drain regions SD11 through SD15 via the second interlayer insulating layer 32. According to some example embodiments, at least one of the first through fifth source/drain contacts CA1 through CA5 may be formed as a lower source/drain contact penetrating the first interlayer insulating layer 31 and an upper source/drain contact penetrating the second interlayer insulating layer 32. A first gate contact CB1 may be connected to the first gate electrode G1 through the second interlayer insulating layer 32. First through third source/drain vias VA1 through VA3 may be respectively connected to the first, third, and fifth source/drain contacts CA1, CA3, and CA5 through the third interlayer insulating layer 33, and commonly connected to a first conductive pattern PT1 formed in the first wiring layer M1. Accordingly, the first conductive pattern PT1 may be electrically connected to the first source/drain region SD11 through the first source/drain via VA1 and the first source/drain contact CA1, electrically connected to the third source/drain region SD13 through the second source/drain via VA2 and the third source/drain contact CA3, and electrically connected to the fifth source/drain region SD15 via the third source/drain via VA3 and the fifth source/drain contact CA5. A layer where the first through third source/drain vias VA1 through VA3 are formed may be referred to as a first via layer, and a layer where the first conductive pattern PT1 and the fourth interlayer insulating layer 34 are formed may be referred to as the first wiring layer M1.

Referring to FIG. 4B, the first gate contact CB1 may be connected to the first gate electrode G1 through the second interlayer insulating layer 32, and a first gate via VB1 may be connected to the first gate contact CB1 and the input pin A through the third interlayer insulating layer 33. Accordingly, the input pin A may be electrically connected to the first gate electrode G1 through the first gate via VB1 and the first gate contact CB1. A second gate contact CB2 may be connected to the third gate electrode G3 through the second interlayer insulating layer 32, and a second gate via VB2 may be connected to the second gate contact CB2 and the input pin C through the third interlayer insulating layer 33. Accordingly, the input pin C may be electrically connected to the third gate electrode G3 through the second gate via VB2 and the second gate contact CB2. According to some example embodiments, unlike as shown in FIG. 4B, the first gate contact CB1 or the second gate contact CB2 may be omitted, and the input pin A may be electrically connected to the first gate electrode G1 and the input pin C may be electrically connected to the third gate electrode G3 through a gate via penetrating the second and third interlayer insulating layers 32 and 33. A fifth interlayer insulating layer 35 and a sixth interlayer insulating layer 36 may be formed on the fourth interlayer insulating layer 34. A layer where the fifth interlayer insulating layer 35 is formed may be referred to as a second via layer, and a layer where the sixth interlayer insulating layer 36 is formed may be referred to as a second wiring layer M2. A third conductive pattern PT3 may be formed on the second wiring layer M2. As shown in FIG. 3, a conductive pattern PT may be connected to the output pin Y through vias V0 and V1, and electrically connect a PFET and an NFET to each other.

Referring to FIG. 4C, a field insulating layer 20 may be formed on the substrate 11. The field insulating layer 20 may include, as a non-limiting examples, silicon oxide (SiO2), silicon nitride (SiN), silicon oxynitride (SiON), silicon oxycarbide nitride (SiOCN), or a combination thereof. According to some example embodiments, as shown in FIG. 4C, the field insulating layer 20 may surround an active pattern, i.e., some of side surfaces of fins. The first through sixth interlayer insulating layers 31 through 36 may be formed on the field insulating layer 20. First through fourth fins F01 through F04 may extend in the X-axis direction from the field insulating layer 20, and four source/drain regions SD13 through SD43 may be formed on the first through fourth fins F01 through F04. A device isolation layer ISO may extend in the X-axis direction between the second fin F02 and the third fin F03.

The third source/drain contact CA3 may be connected to two source/drain regions SD23 and SD13 by penetrating the second interlayer insulating layer 32, and accordingly, the two source/drain regions SD23 and SD13 may be electrically connected to each other. Also, a sixth source/drain contact CA6 may be connected to the two source/drain regions SD43 and SD33 by penetrating the second interlayer insulating layer 32, and accordingly, the two source/drain regions SD43 and SD33 may be electrically connected to each other. The second source/drain via VA2 may be connected to the third source/drain contact CA3 by penetrating the third interlayer insulating layer 33 and may be connected to the first conductive pattern PT1. Also, a fourth source/drain via VA4 may be connected to the sixth source/drain contact CA6 by penetrating the third interlayer insulating layer 33 and may be connected to the output pin Y. A first upper via VC1 may be connected to a second conductive pattern PT2 by penetrating the fifth interlayer insulating layer 35 and may be connected to the third conductive pattern PT3. Also, a second upper via VC2 may be connected to the output pin Y by penetrating the fifth interlayer insulating layer 35 and may be connected to the third conductive pattern PT3. Accordingly, the output pin Y and the second conductive pattern PT2 may be electrically connected to each other.

Referring to FIG. 4D, the field insulating layer 20 may be formed on the substrate 11, and the first through fourth fins F01 through F04 penetrating the field insulating layer 20 and the first gate electrode G1 extending in the Y-axis direction may cross each other. The first gate electrode G1 may include, as non-limiting examples, titanium (Ti), tantalum (Ta), tungsten (W), aluminum (Al), copper (Co), or a combination thereof, or may include Si or SiGe that is not a metal. Also, the first gate electrode G1 may be formed as two or more stacked conductive materials, and for example, may include a work function adjusting layer including titanium nitride (TiN), tantalum nitride (TaN), titanium carbide (TiC), titanium carbide (TaC), titanium aluminum carbide (TiAlC), or a combination thereof, and a filling conductive layer including W or Al.

Figure 5:
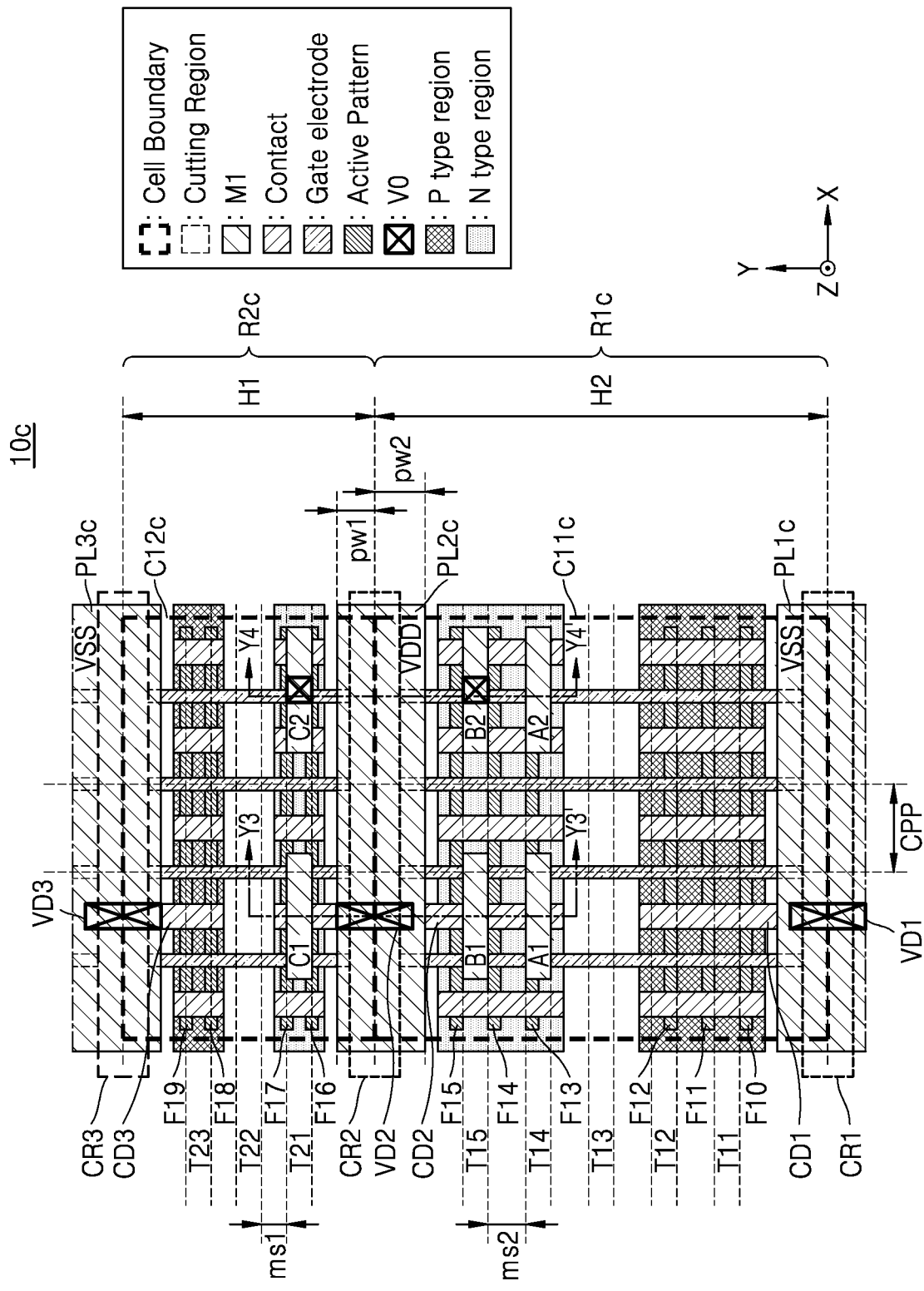
FIG. 5 is a view for describing an integrated circuit including an asymmetric power line, according to an example embodiment.

FIG. 5 is a view for describing an integrated circuit 10c including an asymmetric power line, according to an example embodiment. Referring to FIG. 5, a first cell C11c may be an HP cell having a height H2 and a second cell C12c may be an HD cell having a height H1. The first cell C11c may be arranged on a first row R1c having the height H2 and the second cell C12c may be arranged on a second row R2c having the height H1. The first cell C11c may use five tracks, i.e., first through fifth tracks T11 through T15, while the second cell C12c may use three tracks, i.e., sixth through eighth tracks T21 through T23. In other words, the HP cell having a relatively high height may use more tracks than the HD cell having a relatively low height. A track may be a region where a conductive pattern may be arranged. The first cell C11c may include four conductive patterns, i.e., first, fourth, second, and fifth conductive patterns A1, A2, B1, and B2. The first conductive pattern A1 and the fourth conductive pattern A2 may be arranged on the fourth track T14, the second conductive pattern B1 and the fifth conductive pattern B2 may be arranged on the fifth track T15, and a third conductive pattern C1 and a sixth conductive pattern C2 may be arranged on the sixth track T21. Tracks may be spaced apart from each other by minimum spacing according to a design rule. The first through fifth tracks T11 through T15 that may be used in the first cell C11c may be spaced apart from each other by second minimum spacing ms2. The sixth through eighth tracks T21 through T23 that may be used in the second cell C12c may be spaced apart from each other by first minimum spacing ms1.

A first power line PL1c may be connected to a first contact CD1 through a first via VD1. In other words, the first power line PL1c may provide a negative supply voltage VSS to the first cell C11c through the first via VD1. A second power line PL2c may be connected to a second contact CD2 through a second via VD2. In other words, the second power line PL2c may provide a positive supply voltage VDD to the first cell C11c and the second cell C12c through the second via VD2. A third power line PL3c may be connected to a third contact CD3 through a third via VD3. In other words, the third power line PL3c may provide the negative supply voltage VSS to a second cell C12c through the third via VD3.

Centers of the first through third vias VD1 through VD3 connecting a cell and a power line to each other may be located on a row boundary. In other words, the row boundary may pass the centers of first through third vias VD1 through VD3 in an X-axis direction. Accordingly, the integrated circuit 10c according to an example embodiment may include the power line having an asymmetric width based on a line crossing the centers of the first through third vias VD1 through VD3 connecting the cell and the power line in the X-axis direction. For example, the second power line PL2c may be divided into a partial power line in a first direction and a partial power line in a second direction, based on the line crossing the center of the second via VD2 in the X-axis direction. The partial power line in the first direction may have a width pw1, and the partial power line in the second direction may have a width pw2. Accordingly, the width of the second power line PL2c may be a sum of the width pw1 and the width pw2.

The width of the partial power line may be proportional to the number of tracks assigned to a cell overlapping the partial power line. The partial power line of the second power line PL2c in the first direction may overlap the second cell C12c, and the partial power line of the second power line PL2c in the second direction may overlap the first cell C11. The width pw2 may be greater than the width pw1 because the three tracks, i.e., the sixth through eighth tracks T21 through T23, are assigned to the second cell C12c and the five tracks, i.e., the first through fifth tracks T11 through T15, are assigned to the first cell C11c.

As shown in FIG. 5, a pitch CPP of gate electrodes included in the first cell C11c may be the same as a pitch CPP of gate electrodes included in the second cell C12c. Accordingly, the first cell C11c and the second cell C12c may each be arranged on rows having different heights, while the gate electrodes of the first cell C11c and the gate electrodes of the second cell C12c may be aligned in a Y-axis direction. Gate electrodes included in cells adjacent in the Y-axis direction may be cut by first through third cutting regions CR1 through CR3 extending in the X-axis direction. For example, the second cutting region CR2 may cut the gate electrodes included in the first cell C11c and the gate electrodes included in the second cell C12c. In other words, the gate electrodes of the first cell C11c and the gate electrodes of the second cell C12c, which are aligned in the Y-axis direction, may be electrically isolated by the second cutting region CR2. The first through third cutting regions CR1 through CR3 may overlap the row boundary. In other words, the row boundary may cross centers of the first through third cutting regions CR1 through CR3 in the X-axis direction. According to an example embodiment, a line crossing the centers of the first through third cutting regions CR1 through CR3 in the X-axis direction may match the row boundary. Accordingly, the integrated circuit 10c according to an example embodiment may include the power line having the asymmetric width based on the line crossing the centers of the first through third cutting regions CR1 through CR3 in the X-axis direction. For example, the second power line PL2c may be divided into the partial power line in the first direction and the partial power line in the second direction, based on the line crossing the center of the second cutting region CR2 in the X-axis direction. The partial power line in the first direction may have the width pw1, and the partial power line in the second direction may have the width pw2. Accordingly, the width of the second power line PL2c may be a sum of the width pw1 and the width pw2.

Figure 6A:
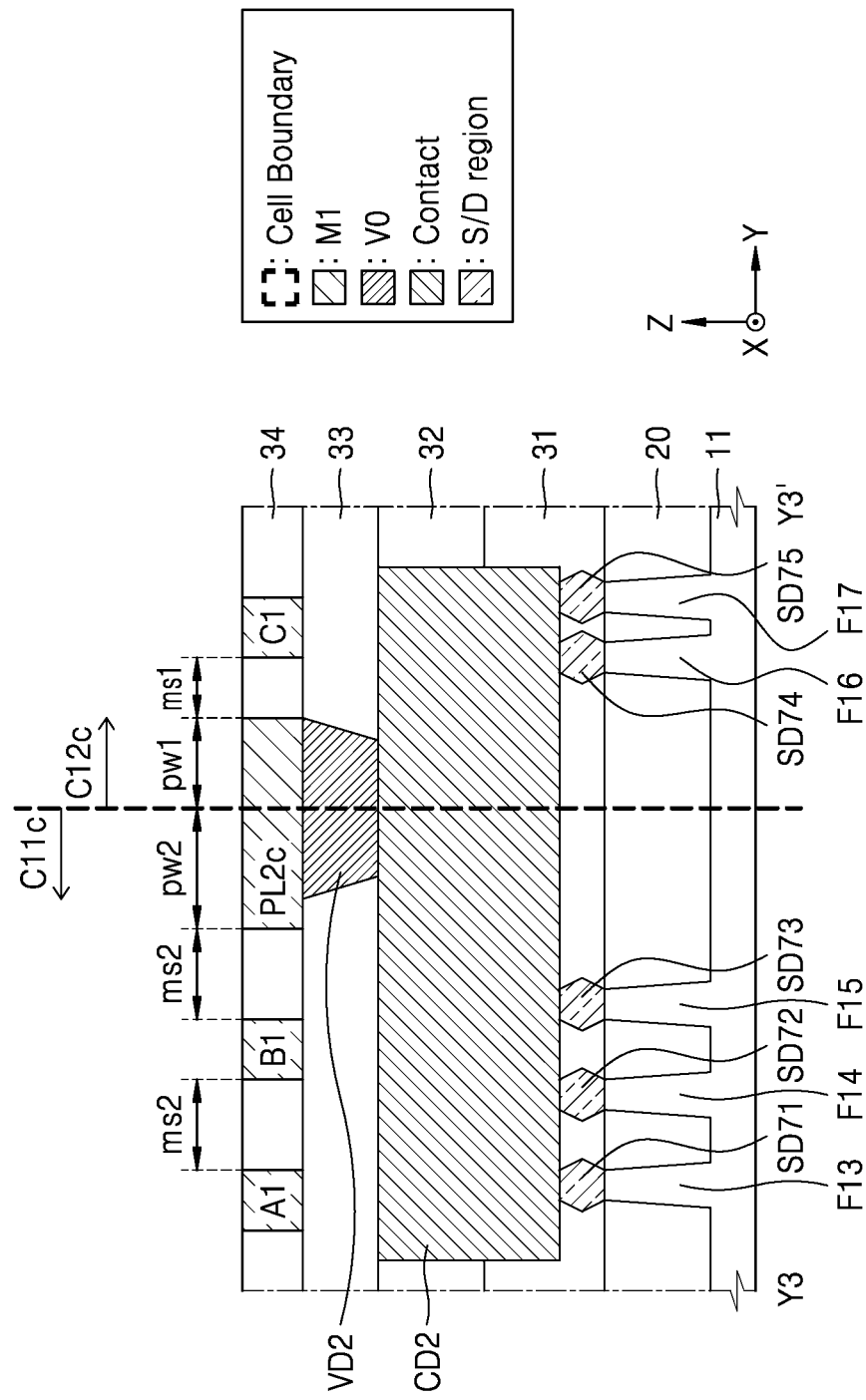
FIGS. 6A and 6B are cross-sectional views showing examples of structures of cells, according to an example embodiment.
Figure 6B:
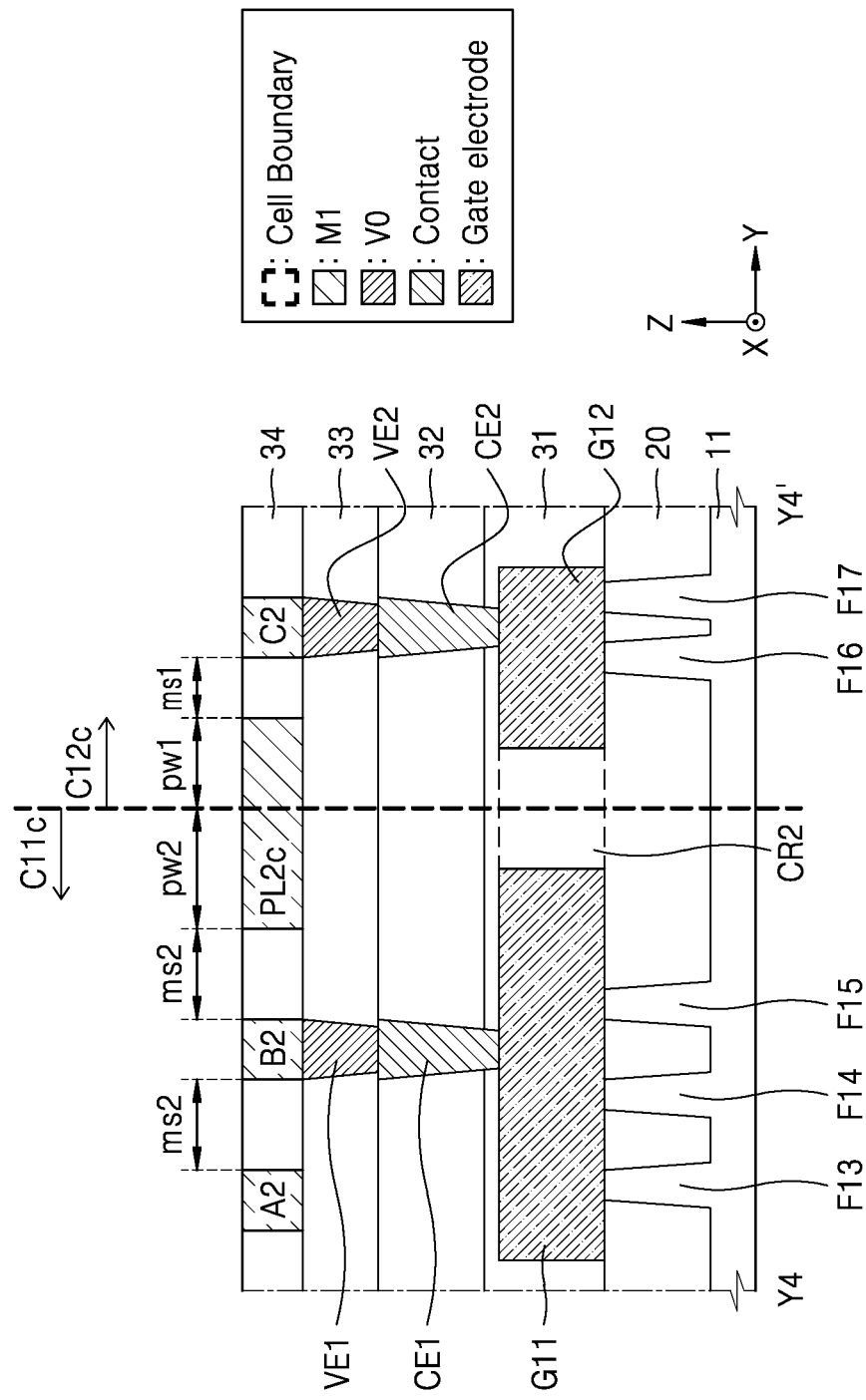

FIGS. 6A and 6B are cross-sectional views showing examples of structures of the first and second cells C11c and C12c, according to an example embodiment. In detail, FIG. 6A is the cross-sectional view of a boundary of the first cell C11c and the second cell C12c taken along a line Y3-Y3' of FIG. 5, and FIG. 6B is the cross-sectional view of a boundary of the first cell C11c and the second cell C12c taken along a line Y4-Y4' of FIG. 5. For convenience of description, a cell boundary is illustrated, but a row boundary may also overlap the cell boundary.

Referring to FIG. 6A, the field insulating layer 20 and the plurality of first through fourth interlayer insulating layers 31 through 34 may be formed on the substrate 11. The field insulating layer 20 may surround some of side surfaces of third through seventh fins F13 through F17. First through fifth source/drain regions SD71 through SD75 may be formed in the third through seventh fins F13 through F17. The second contact CD2 may be connected to the first through fifth source/drain regions SD71 through SD75 by penetrating the second interlayer insulating layer 32. The second contact CD2 may be connected to the second via VD2. The second via VD2 may be connected to the second contact CD2 by penetrating the third interlayer insulating layer 33. The second via VD2 may be connected to the second power line PL2c. Accordingly, the second power line PL2c may provide the positive supply voltage VDD to the first through fifth source/drain regions SD71 through SD75.

The width of the second power line PL2c may be asymmetric based on the line penetrating the center of the second via VD2 in the X-axis direction. In other words, the cell boundary may pass the center of second via VD2 in the X-axis direction. As shown in FIG. 5, because the cell boundary and the row boundary may overlap each other, the row boundary may also pass through the center of the second via VD2 in the X-axis direction. The second power line PL2c may be divided into the partial power line in the first direction and the partial power line in the second direction, based on the line penetrating the center of the second via VD2 in the X-axis direction. Based on the line penetrating the center of the second via VD2 in the X-axis direction, a region in a +Y-axis direction may be the partial power line in the first direction and a region in a −Y-axis direction may be the partial power line in the second direction. Because the second cell C12c has the height H1, the partial power line in the first direction may have the width pw1. Because the first cell C11c has the height H2, the partial power line in the second direction may have the width pw2. The width pw2 may be greater than the width pw1.

Even when the partial power line in the second direction has the width pw2, the second conductive pattern B1 and the second power line PL2c may be spaced apart from each other by the second minimum spacing ms2. However, when the partial power line in the first direction has the width pw2, a distance between the third conductive pattern C1 and the second power line PL2c is closer than the first minimum spacing ms1, and thus, the design rule may be violated. Accordingly, the integrated circuit 10c according to an example embodiment may arrange a power line having different widths based on the line penetrating the center of the second via VD2 in the X-axis direction to prevent violation of the design rule.

Referring to FIG. 6B, the second cutting region CR2 may be arranged below the second power line PL2c. A first gate electrode G11 included in the first cell C11c and a second gate electrode G12 included in the second cell C12c may be terminated by the second cutting region CR2. A first gate contact CE1 may be connected to the first gate electrode G11 by penetrating the second interlayer insulating layer 32 and may be connected to a first gate via VE1. The first gate via VE1 may be connected to the first gate contact CE1 by penetrating the third interlayer insulating layer 33 and may be connected to the fifth conductive pattern B2. A second gate contact CE2 may be connected to the second gate electrode G12 by penetrating the second interlayer insulating layer 32 and may be connected to a second gate via VE2. The second gate via VE2 may be connected to the second gate contact CE2 by penetrating the third interlayer insulating layer 33 and may be connected to the sixth conductive pattern C2.

The width of the second power line PL2c may be asymmetric based on the line penetrating the center of the second cutting region CR2 in the X-axis direction. In other words, the cell boundary may pass through the center of the second cutting region CR2 in the X-axis direction. As shown in FIG. 5, because the cell boundary and the row boundary may overlap each other, the row boundary may also pass through the center of the second cutting region CR2 in the X-axis direction. The second power line PL2c may be divided into the partial power line in the first direction and the partial power line in the second direction, based on the line penetrating the center of the second cutting region CR2 in the X-axis direction. Based on the line penetrating the center of the second cutting region CR2 in the X-axis direction, a region in a +Y-axis direction may be the partial power line in the first direction and a region in a −Y-axis direction may be the partial power line in the second direction. Because the second cell C12c has the height H1, the partial power line in the first direction may have the width pw1. Because the first cell C11c has the height H2, the partial power line in the second direction may have the width pw2. The width pw2 may be greater than the width pw1.

Even when the partial power line in the second direction has the width pw2, the fifth conductive pattern B2 and the second power line PL2c may be spaced apart from each other by the second minimum spacing ms2. However, when the partial power line in the first direction has the width pw2, a distance between the sixth conductive pattern C2 and the second power line PL2c is closer than the first minimum spacing ms1, and thus, the design rule may be violated. Accordingly, the integrated circuit 10c according to an example embodiment may arrange a power line having different widths based on the line penetrating the center of the second cutting region CR2 in the X-axis direction to prevent violation of the design rule.

Figure 7:
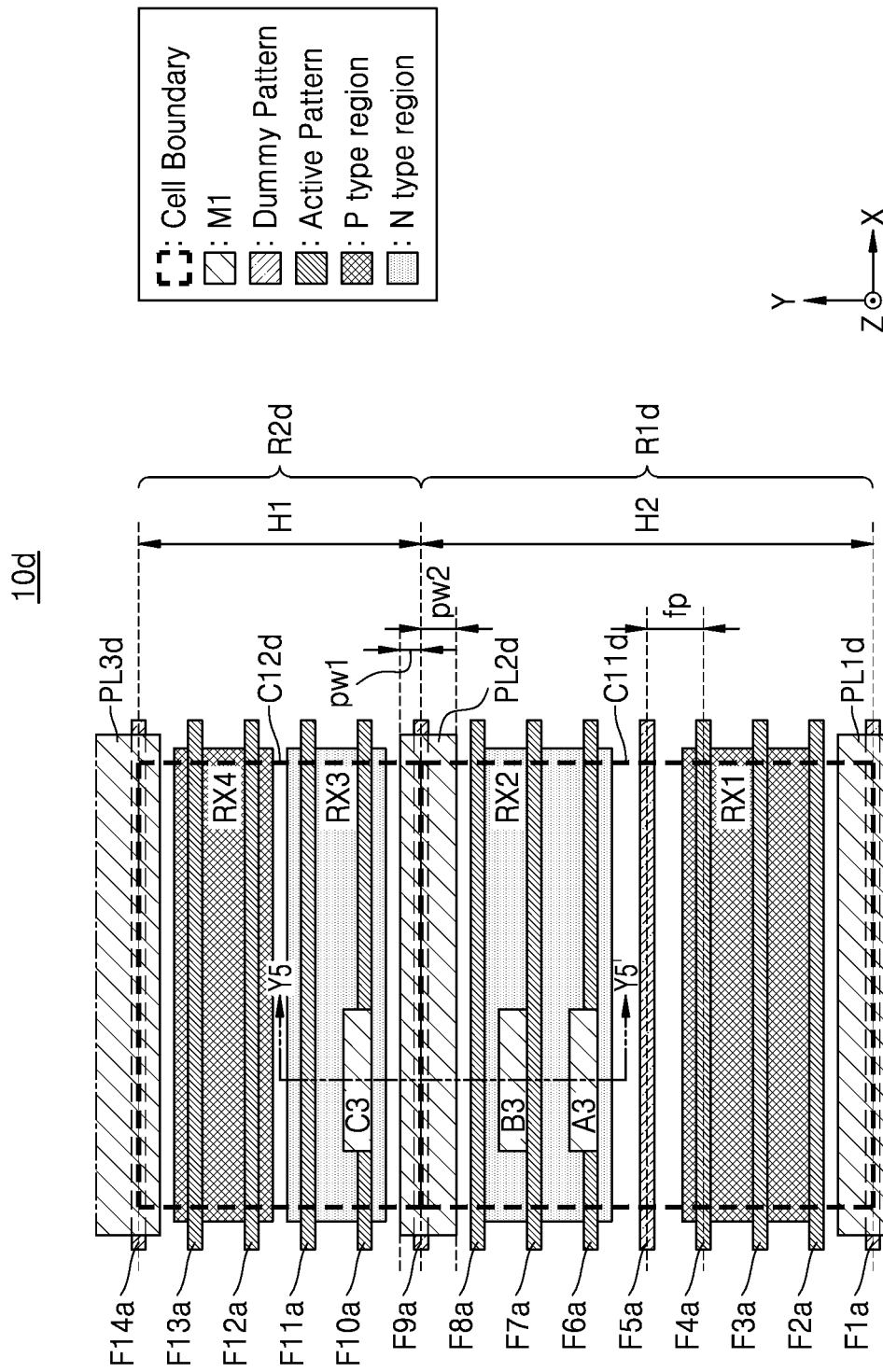
FIG. 7 is a view for describing an integrated circuit including an asymmetric power line, according to an example embodiment.

FIG. 7 is a view for describing an integrated circuit 10d including an asymmetric power line, according to an example embodiment. Referring to FIG. 7, a first cell C11d may be an HP cell having a height H2 and a second cell C12d may be an HD cell having a height H1. The first cell C11d may be arranged on a first row R1d having the height H2, and the second cell C12d may be arranged on a second row R2d having the height H1. The integrated circuit 10d may include first through third conductive patterns A3 through C3.

The integrated circuit 10d may include first through fourteenth fins F1a through F14a. A fin may be one of an active fin and a dummy fin. The active fin may be a fin used to form a transistor, and the dummy fin may be a fin not used to form a transistor. The active fin may be a fin formed in an active region. The dummy fin may be a fin arranged below a power line. Accordingly, the first, fifth, ninth, and fourteenth fins F1a, F5a, F9a, and F14a may be dummy fins and second, third, fourth, sixth, seventh, eight, tenth, eleventh, twelfth, and thirteenth fins F2a, F3a, F4a, F6a, F7a, F8a, F10a, F11a, and F13a may be active fins. The plurality of active fins may extend in an X-axis direction from active regions RX1 through RX4, and the active fin may form a transistor by crossing with a gate electrode extending in a Y-axis direction. The first through fourteenth fins F1a through F14a may be spaced apart from each other by a fin pitch fp. The height of each of the first and second cells C11d and C12d may correspond to an integer multiple of the fin pitch fp. For example, the height H2 of the first cell C11d may correspond to nine times the fin pitch fp and the height H1 of the second cell C12d may correspond to six times the fin pitch fp. Accordingly, a cell having a relatively high height may include more fins than a cell having a relatively low height.

The width of a partial power line may be proportional to the number of fins included in a cell overlapping the partial power line. A partial power line of a second power line PL2d in a first direction may overlap the second cell C12d, and a partial power line of the second power line PL2d in a second direction may overlap the first cell C11d. Because the second cell C12d includes 5 fins and the first cell C11d includes 8 fins, a width pw2 of the partial power line in the second cell C12d may be greater than a width pw1 of the partial power line in the first direction.

A boundary of cells adjacent in the Y-axis direction may be located along a dummy fin. Because the ninth fin F9a is arranged below a power line, the ninth fin F9a may be a dummy fin. Accordingly, a boundary of the first cell C11d and the second cell C12d may be located along the ninth fin F9a. In other words, a cell boundary may pass the center of the dummy fin arranged below the power line in the X-axis direction. As shown in FIG. 7, because the cell boundary and the row boundary may overlap each other, the row boundary may also pass through the center of the ninth fin F9a in the X-axis direction. Accordingly, the integrated circuit 10d according to an example embodiment may include the power line having the asymmetric width based on the line crossing the center of the dummy fin arranged below the power line in the X-axis direction. For example, the second power line PL2d may be divided into the partial power line in the first direction and the partial power line in the second direction, based on the line crossing the center of the ninth fin F9a in the X-axis direction. The partial power line in the first direction may have the width pw1, and the partial power line in the second direction may have the width pw2. Accordingly, the width of the second power line PL2d may be a sum of the width pw1 and the width pw2.

Figure 8:
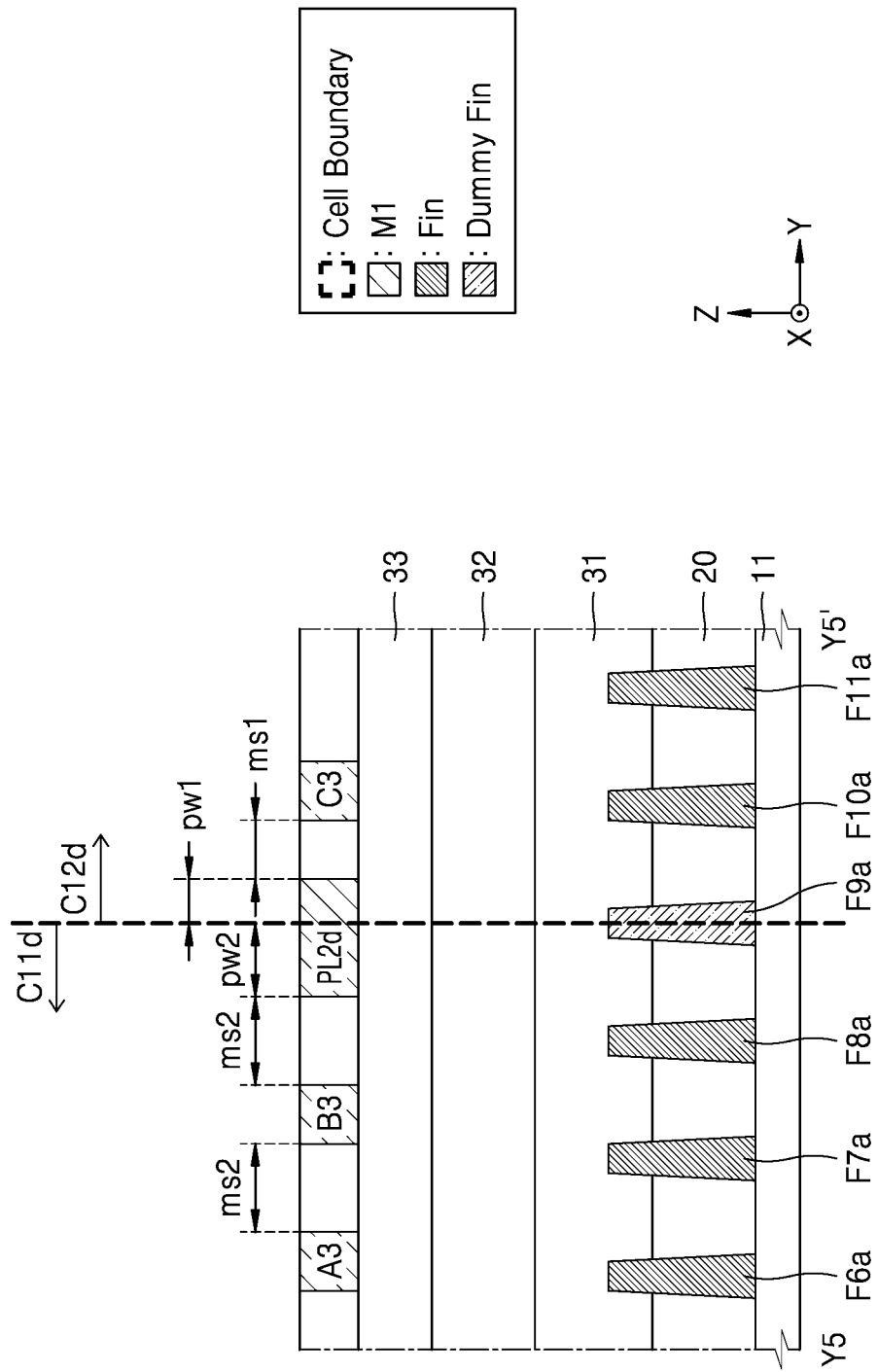
FIG. 8 is a cross-sectional view showing an example of structures of cells, according to an example embodiment.

FIG. 8 is a cross-sectional view showing an example of structures of the first and second cells C11d and C12d, according to an example embodiment. In detail, FIG. 8 is the cross-sectional view of a boundary of the first cell C11d and the second cell C12d taken along a line Y5-Y5' of FIG. 7. For convenience of description, a cell boundary is illustrated, but a row boundary may also overlap the cell boundary.

Referring to FIG. 8, a dummy fin, i.e., the ninth fin F9a, may be arranged below the second power line PL2d. The width of the second power line PL2d may be asymmetric based on the line penetrating the center of the ninth fin F9a in the X-axis direction. In other words, the cell boundary may pass the center of ninth fin F9a in the X-axis direction. The second power line PL2d may be divided into the partial power line in the first direction and the partial power line in the second direction, based on the line penetrating the center of the ninth fin F9a in the X-axis direction. Based on the line penetrating the center of the ninth fin F9a in the X-axis direction, a region in a +Y-axis direction may be the partial power line in the first direction and a region in a −Y-axis direction may be the partial power line in the second direction. As described above with reference to FIGS. 2A and 2B, the second cell C12d has the height H1, and thus, the partial power line in the first direction may have the width pw1. Because the first cell C11d has the height H2, the partial power line in the second direction may have the width pw2. The width pw2 may be greater than the width pw1.

Even when the partial power line in the second direction has the width pw2, the second conductive pattern B3 and the second power line PL2d may be spaced apart from each other by the second minimum spacing ms2. However, when the partial power line in the first direction has the width pw2, a distance between the third conductive pattern C3 and the second power line PL2d is closer than the first minimum spacing ms1, and thus, the design rule may be violated. Accordingly, the integrated circuit 10d according to an example embodiment may arrange a power line having different widths based on the line penetrating the center of dummy fin arranged below the power line in the X-axis direction to prevent violation of the design rule.

Figure 9:
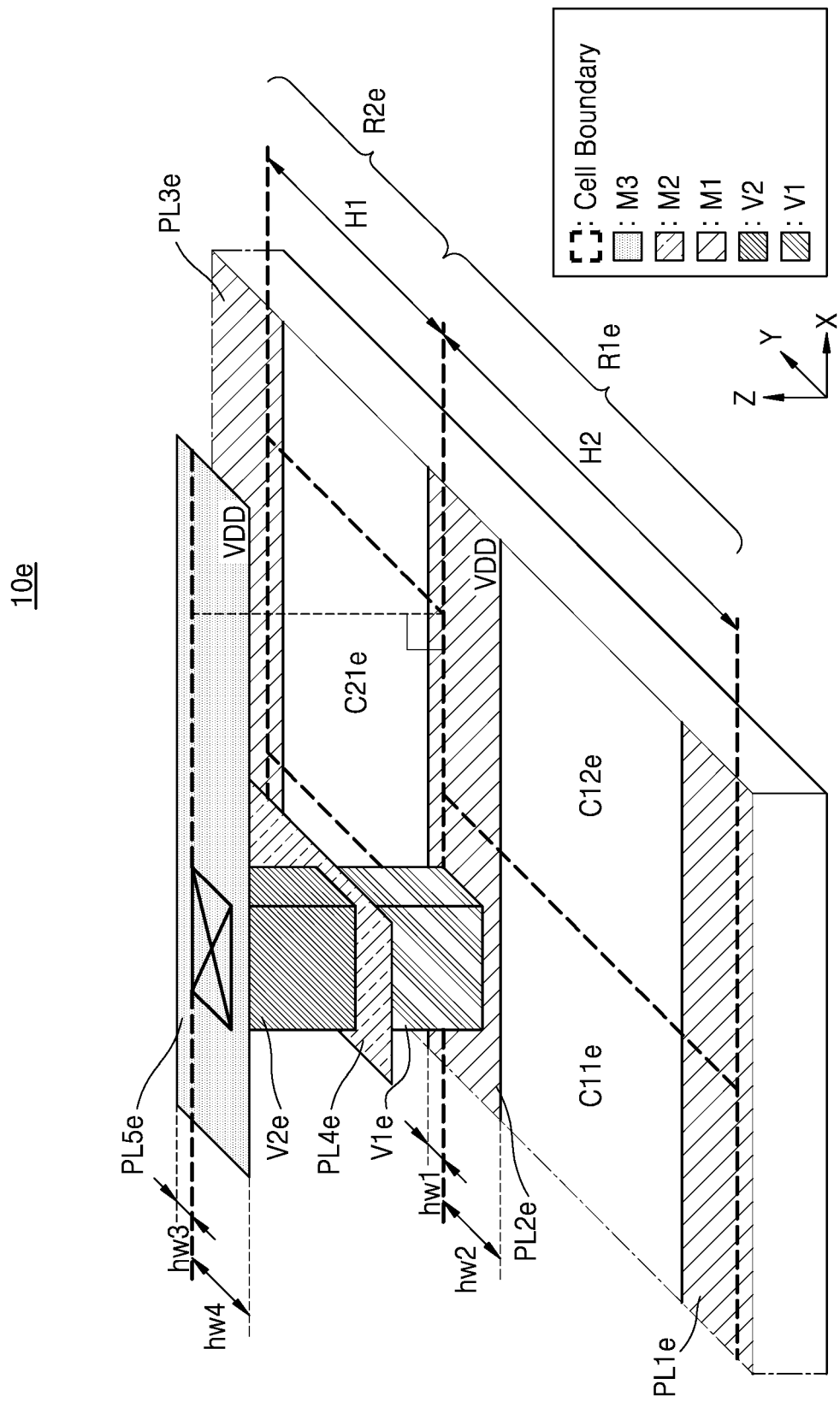
FIG. 9 is a view for describing an integrated circuit according to an example embodiment.

FIG. 9 is a view for describing an integrated circuit 10e according to an example embodiment. Referring to FIG. 9, the integrated circuit 10e may include first through third cells C11e through C21e. The first and second cells C11e and C12e may be HP cells having a height H2, and the third cell C21e may be an HD cell having a height H1. The first and second cells C11e and C12e may be arranged on a first row R1e, and the third cell C21e may be arranged on a second row R2e. The first row R1e may be an HP row having the height H2, and the second row R2e may be an HD row having the height H1.

The first through third cells C11e through C21e may receive a positive supply voltage VDD or a negative supply voltage VSS from first through third power lines PL1e through PL3e. For example, the first through third cells C11e through C21e may receive the positive supply voltage VDD from the second power line PL2e. The second power line PL2e may extend in an X-axis direction from a first wiring layer M1. The second power line PL2e may be connected to a first via V1e formed in a second via layer V1. The first via V1e may be connected to a fourth power line PL4e extending in a Y-axis direction from a second wiring layer M2. The fourth power line PL4e may transmit the positive supply voltage VDD to the second power line PL2e. The fourth power line PL4e may be connected to a second via V2e formed on a third via layer V2. The third via layer V2 may be located above the second via layer V1. It has been described that the fourth power line PL4e extends in the Y-axis direction, but example embodiments are not limited thereto. In other words, the fourth power line PL4e may extend in the X-axis direction. The second via V2e may be connected to a fifth power line PL5e extending in the X-axis direction from a third wiring layer M3. The fifth power line PL5e may transmit the positive supply voltage VDD to the fourth power line PL4e. It has been described that the fifth power line PL5e extends in the X-axis direction, but example embodiments are not limited thereto. In other words, the fifth power line PL5e may extend in the Y-axis direction.

According to a design rule, conductive patterns formed on the third wiring layer M3 may need to be spaced apart from each other by a minimum spacing. Accordingly, a power line having an asymmetric width described with reference to FIGS. 1, 2A, 2B, 3, 4A, 4B, 4C, 4D, 6A, 6B, 7 and 8 may also be applied to the third wiring layer M3. However, example embodiments are not limited thereto, and a power line having an asymmetric width may be formed regardless of a wiring layer. Accordingly, the fifth power line PL5e may be divided into a partial power line in a first direction and a partial power line in a second direction, based on a row boundary or a cell boundary. The width of the partial power line may be determined according to the height of a cell overlapping the partial power line. A width hw3 of the partial power line in the first direction of the fifth power line PL5e may be less than a width hw4 of the partial power line in the second direction. For convenience of description, it is shown that the fifth power line PL5e is connected only to the second power line PL2e, but the fifth power line PL5e extending in the Y-axis direction may be connected to a plurality of power lines formed on the first wiring layer M1 and providing the positive supply voltage VDD. Accordingly, the fifth power line PL5e may have a greater width than the first through third power lines PL1e through PL3e so as to provide a stable voltage to power lines of the first wiring layer M1.

Figure 10:
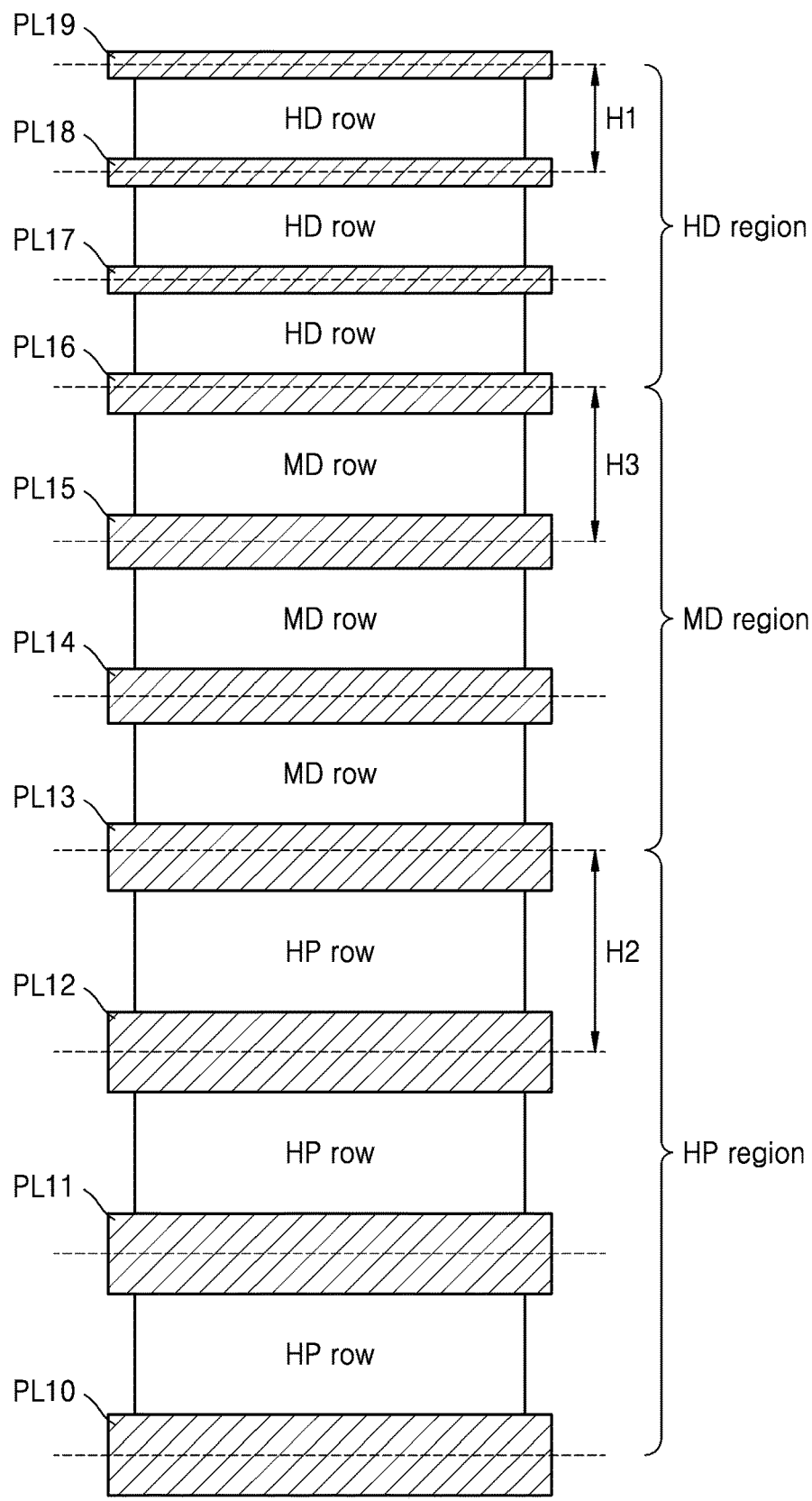
FIG. 10 is a view for describing an integrated circuit according to an example embodiment.

FIG. 10 is a view for describing an integrated circuit 10f according to example embodiments. Referring to FIG. 10, the integrated circuit 10f may include a mixed-rows block including an HD region, a middle density (MD) region, and an HP region.

The HD region may include HD cells arranged on rows each having a height H1, the MD region may include MD cells arranged on rows each having a height H3, and the HP region may include HP cells arranged on rows each having a height H2. Each of the HD cell, the MD cell, and the HP cell may be a single height cell or a multiple height cell. The MD cell may have a greater area and higher performance than the HD cell and have a smaller area and lower performance than the HP cell. In this regard, the height H3 may be greater than the height H1 and less than the height H2 (H2>H3>H1).

The number of rows included in the HD region may be L, the number of rows included in the MD region may be M, and the number of rows included in the HP region may be N, wherein L, M, and N are each a natural number.

The HD cell, the MD cell, and the HP cell may receive a supply voltage from a plurality of power lines PL10 through PL19. The plurality of power lines PL10 through PL19 may be arranged on boundaries of a plurality of rows.

The power lines PL10 through PL12 arranged on boundaries between the HP rows may have symmetric widths based on the boundaries. The power lines PL14 and PL15 arranged on boundaries between the MD rows may have symmetric widths based on the boundaries. The power lines PL17 through PL19 arranged on boundaries between the HD rows may have symmetric widths based on the boundaries.

On the other hand, the power lines PL13 and PL16 arranged on boundaries between regions may have asymmetric widths based on the boundaries between regions.

Figure 11:
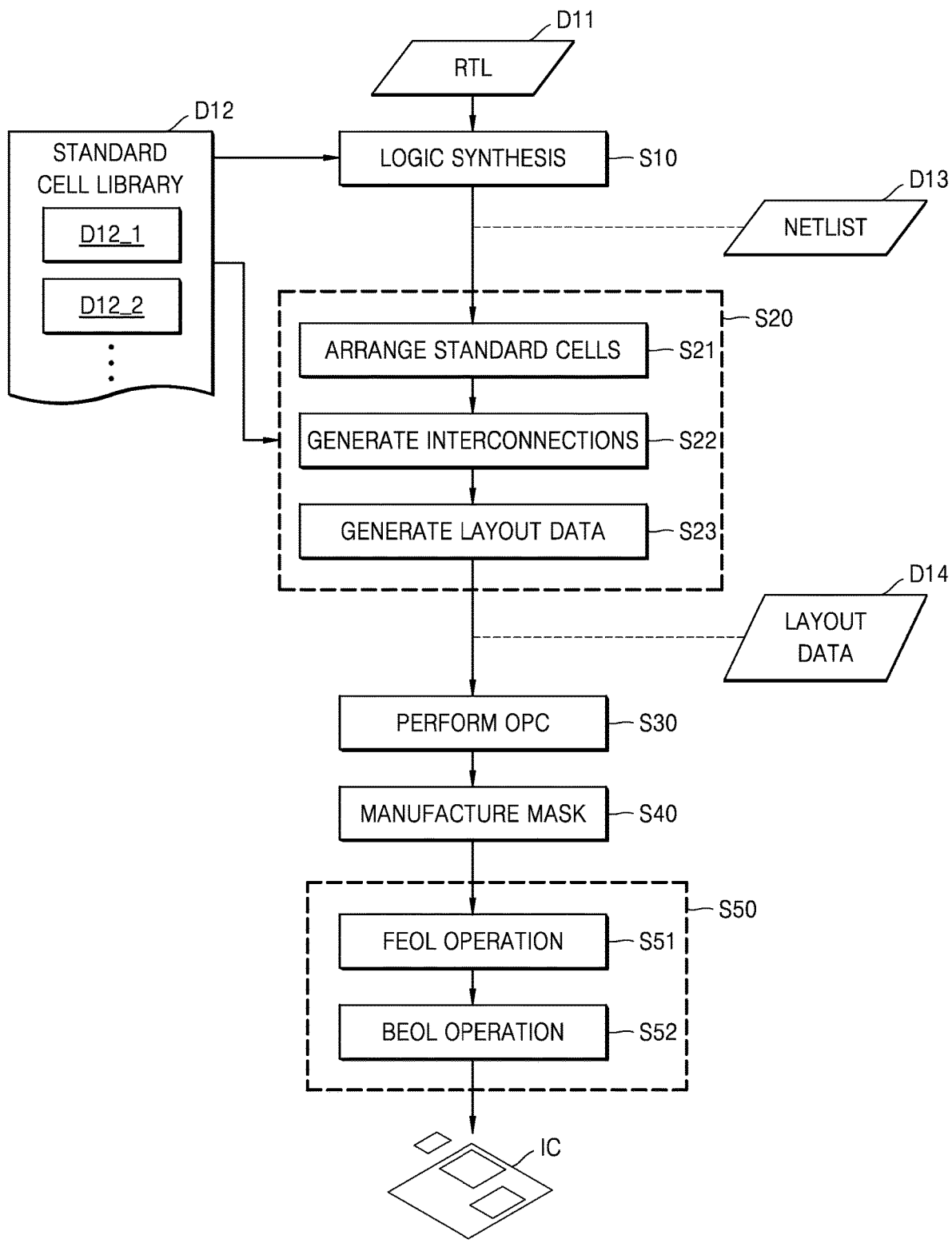
FIG. 11 is a flowchart of a method of fabricating an integrated circuit, according to an example embodiment.

FIG. 11 is a flowchart of a method of fabricating an integrated circuit IC, according to an example embodiment. A cell library (or a standard cell library) D12 may include information about cells, for example, function information, characteristic information, and layout information. As shown in FIG. 11, the cell library D12 may include pieces of data, for example, first data D12_1, second data D12-2, and so on, defining a layout of cells having different heights. For example, the first data D12_1 may define a layout of HD cells having a height H1 like the first cell C11 of FIG. 3, and the second data D12_2 may define a layout of HP cells having a height H2 like the second cell C12 of FIG. 3.

In operation S10, a logic synthesis operation of generating netlist data D13 may be performed based on register transfer logic (RTL) data D11. For example, a semiconductor design tool (for example, a logic synthesis tool) may generate the netlist data D13 including a bitstream or netlist by performing logic synthesis referring to the cell library D12 from the RTL data D11 prepared in hardware description language (HDL) such as VHSIC hardware description language (VHDL) and Verilog. The cell library D12 may include information about a height of a standard cell, the number of pins included in the standard cell, the number of tracks corresponding to the standard cell, and the like, and an HD cell and an HP cell may be included in the integrated circuit IC by referring to such information during the logic synthesis process.

In operation S20, a place and routing (P&R) operation of generating layout data D14 from the netlist data D13 may be performed. As shown in FIG. 11, the P&R operation (operation S20) may include operations S21, S22, and S23.

In operation S21, an operation of arranging cells may be performed. For example, the semiconductor design tool (for example, P&R tool) may arrange a plurality of cells by referring to the cell library D12 from the netlist data D13. As described above, the semiconductor design tool may arrange the HD cell and the HP cell. The P&R operation (operation S20) may include arranging a power line having an asymmetric width. In detail, the P&R operation (operation S20) may include a method of designing an integrated circuit, as described below with reference to FIG. 12.

In operation S22, an operation of generating interconnections may be performed. The interconnections may electrically connect an output pin and an input pin of a cell to each other, and for example, may include at least one via and at least one conductive pattern.

In operation S23, an operation of generating the layout data D14 may be performed. The layout data D14 may have a format, such as Graphic Design System II (GDSII), and may include geometric information of cells and interconnections.

In operation S30, optical proximity correction (OPC) may be performed. The OPC may refer to an operation for forming a pattern of a desired shape by correcting distortion, such as refraction caused by characteristics of light in photolithography included in a semiconductor process for fabricating the integrated circuit IC, and the OPC may be applied to the layout data D14 to determine a pattern on a mask. According to some example embodiments, a layout of the integrated circuit IC may be limitedly modified in operation S30, and such limited modification of the integrated circuit IC in operation S30 may be post-processing for optimizing a structure of the integrated circuit IC and referred to as design polishing.

In operation S40, an operation of manufacturing a mask may be performed. For example, patterns on the mask may be defined so as to form the patterns formed on a plurality of layers by applying the OPC on the layout data D14, and at least one mask (or photomask) for forming the patterns on each of the plurality of layers may be manufactured.

In operation S50, an operation of fabricating the integrated circuit IC may be performed. For example, the integrated circuit IC may be fabricated by patterning a plurality of layers by using the at least one mask manufactured in operation S40. As shown in FIG. 11, operation S50 may include operations S51 and S52.

In operation S51, a front-end-of-line (FEOL) operation may be performed. The FEOL operation may include an operation of forming individual devices, for example, a transistor, a capacitor, a resistor, and the like, on a substrate during the fabrication of the integrated circuit IC. For example, the FEOL operation may include planarizing and cleaning a wafer, forming a trench, forming a well, forming a gate line, and forming a source and a drain.

In operation S52, a back-end-of-line (BEOL) operation may be performed. The BEOL operation may include an operation of interconnecting the individual devices, for example, the transistor, the capacitor, the resistor, and the like, during the fabrication of the integrated circuit IC. For example, the BEOL operation may include silicidating gate, source, and drain regions, adding a dielectric material, planarizing, forming a hole, adding a metal layer, forming a via, and forming a passivation layer. Next, the integrated circuit IC may be packaged in a semiconductor package and used as a component of various applications.

Figure 12:
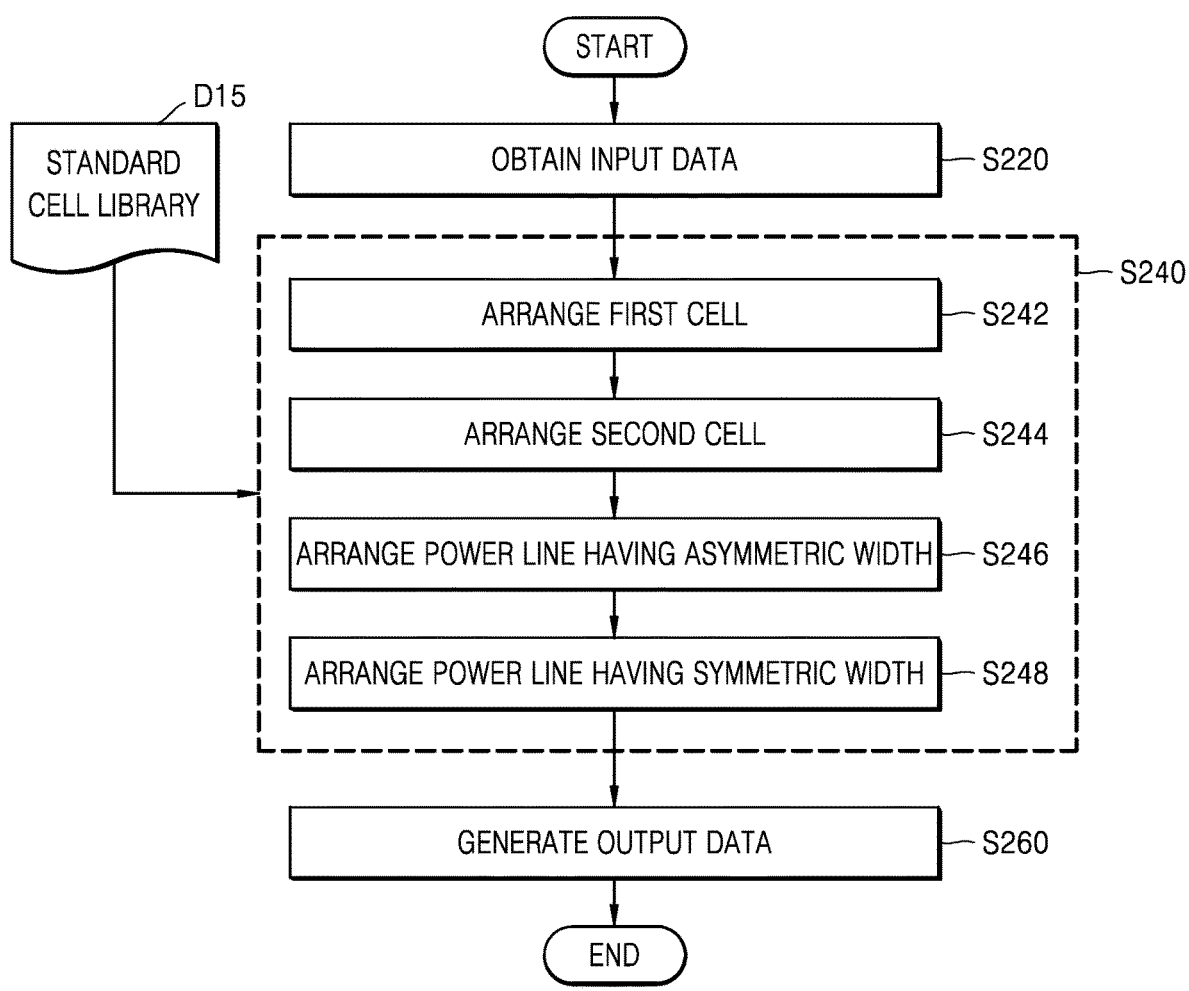
FIG. 12 is a flowchart of a method of designing an integrated circuit, according to an example embodiment.

FIG. 12 is a flowchart of a method of designing an integrated circuit, according to an example embodiment. The method of FIG. 12 may be performed by a computing system (for example, a computing system 130 of FIG. 14) including at least one processor executing a series of instructions. As shown in FIG. 12, the method of designing an integrated circuit may include operations S220, S240, and S260.

In operation S220, an operation of obtaining input data may be performed. The input data may refer to data defining the integrated circuit, and for example, may include a netlist described with reference to FIG. 11. The netlist may include information about cells and connections included in the integrated circuit.

In operation S240, a P&R operation may be performed based on a cell library D15. Operation S240 may include a plurality of operations, i.e., operations S242, S244, S246, and S248. In operation S242, an operation of arranging a first cell may be performed. The first cell may be arranged on a plurality of first rows extending in an X-axis direction. According to some example embodiments, the first cell may be an HD cell described above with reference to FIGS. 1, 2A, 2B, 3, 4A, 4B, 4C, 4D, 6A, 6B and 7 through 9. A height of the HD cell may correspond to an integer multiple of a first height. In other words, a height of a single height cell may correspond to the first height, and a height of a multiple height cell may correspond to n times the first height, wherein n is an integer equal to or greater than 2. In operation S244, an operation of arranging a second cell may be performed. The second cell may be arranged on a plurality of second rows extending in the X-axis direction. The second cell may be an HP cell described above with reference to FIGS. 1, 2A, 2B, 3, 4A, 4B, 4C, 4D5, 6A, 6B and 7 through 9. A height of the HP cell may correspond to an integer multiple of a second height. In other words, a height of a single height cell may correspond to the second height, and a height of a multiple height cell may correspond to n times the second height, wherein n is an integer equal to or greater than 2. As described above with reference to FIG. 1, a ratio of the first row to the second row may be adjusted according to the performance and integration of the integrated circuit. The cell library D15 may define an HD cell group and an HP cell group. The HD cell group may include cells having heights corresponding to the integer multiple of the first height. The HP cell group may include cells having heights corresponding to the integer multiple of the second height. At least one cell in the HD cell group may perform a same function as at least one cell in the HP cell group.

In operation S246, an operation of arranging a power line having an asymmetric width may be performed. The power line having the asymmetric width may be arranged on a boundary of the first cell and the second cell. Alternatively, the power line having the asymmetric width may be arranged on a boundary of the first row and the second row. The width of the power line may be asymmetric based on a cell boundary or a row boundary. The power line having the asymmetric width may be arranged as described above with reference to FIGS. 2A, 2B, 3, 4A, 4B, 4C, 4D, 6A, 6B and 7 through 9.

In operation S248, an operation of arranging a power line having a symmetric width may be performed. The power line having the symmetric width may be arranged on a boundary between the first cells or a boundary between the second cells. Alternatively, the power line having the symmetric width may be arranged on a boundary between the first rows or a boundary between the second rows. The width of the power line may be symmetric based on the cell boundary or the row boundary.

In operation S260, an operation of generating output data may be performed. The output data may refer to data defining a layout of the integrated circuit and include the layout data D14 described above with reference to FIG. 12. The output data may define the layout of the integrated circuit including the power line having the asymmetric width or the power line having the symmetric width.

Figure 13:
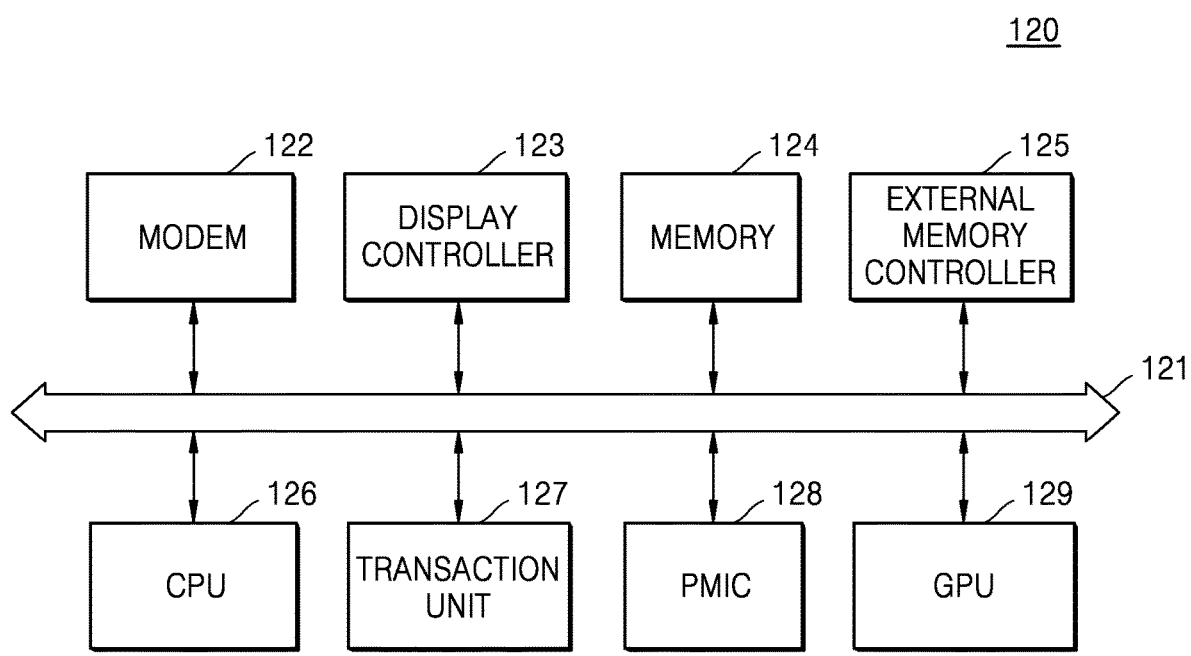
FIG. 13 is a block diagram of a system-on-chip (SoC) according to an example embodiment.

FIG. 13 is a block diagram of a system-on-chip (SoC) 120 according to an example embodiment. The SoC 120 is a semiconductor device and may include an integrated circuit according to an example embodiment. The SoC 120 is obtained by implementing complex functional blocks, such as intellectual property (IP) blocks performing various functions, on one chip. Power lines having asymmetric widths according to example embodiments may be included in each functional block of the SoC 120 and accordingly, the SoC 120 capable of preventing violation of a design rule may be achieved.

Referring to FIG. 13, the SoC 120 may include a modem 122, a display controller 123, a memory 124, an external memory controller 125, a central processing unit (CPU) 126, a transaction unit 127, a power management integrated circuit (PMIC) 128, and a graphics processing unit (GPU) 129. The functional blocks of the SoC 120 may communicate with each other through a system bus 121.

The CPU 126 may control operations of the SoC 120 in general, and may control operations of the other functional blocks, i.e., the modem 122, the display controller 123, the memory 124, the external memory controller 125, the transaction unit 127, the PMIC 128, and the GPU 129. The modem 122 may demodulate a signal received from outside the SoC 120 or may demodulate a signal generated inside the SoC 120 and transmit the signal to the outside. The external memory controller 125 may control an operation of transmitting or receiving data to or from an external memory device connected to the SoC 120. For example, a program and/or data stored in the external memory device may be provided to the CPU 126 or the GPU 129 under control of the external memory controller 125. The GPU 129 may execute program instructions related to graphics processing. The GPU 129 may receive graphics data via the external memory controller 125 or transmit graphics data processed by the GPU 129 to the outside the SoC 120 via the external memory controller 125. The transaction unit 127 may monitor data transaction of the functional blocks, and the PMIC 128 may control power supplied to each functional block under control of the transaction unit 127. The display controller 123 may transmit data generated in the SoC 120 to a display outside the SoC 120 by controlling the display (or display apparatus).

The memory 124 may include a non-volatile memory such as electrically erasable programmable read-only memory (EEPROM), flash memory, phase change random access memory (PRAM), resistance random access memory (PRAM), nano floating gate memory (NFGM), polymer random access memory (PoRAM), magnetic random access memory (MRAM), or ferroelectric random access memory (FRAM), and may include a volatile memory such as dynamic random access memory (DRAM), static random access memory (SRAM), mobile DRAM, double data rate synchronous dynamic random access memory (DDR SDRAM), low power DDR (LPDDR) SDRAM, graphic DDR (GDDR) SDRAM, or Rambus dynamic random access memory (RDRAM).

Figure 14:
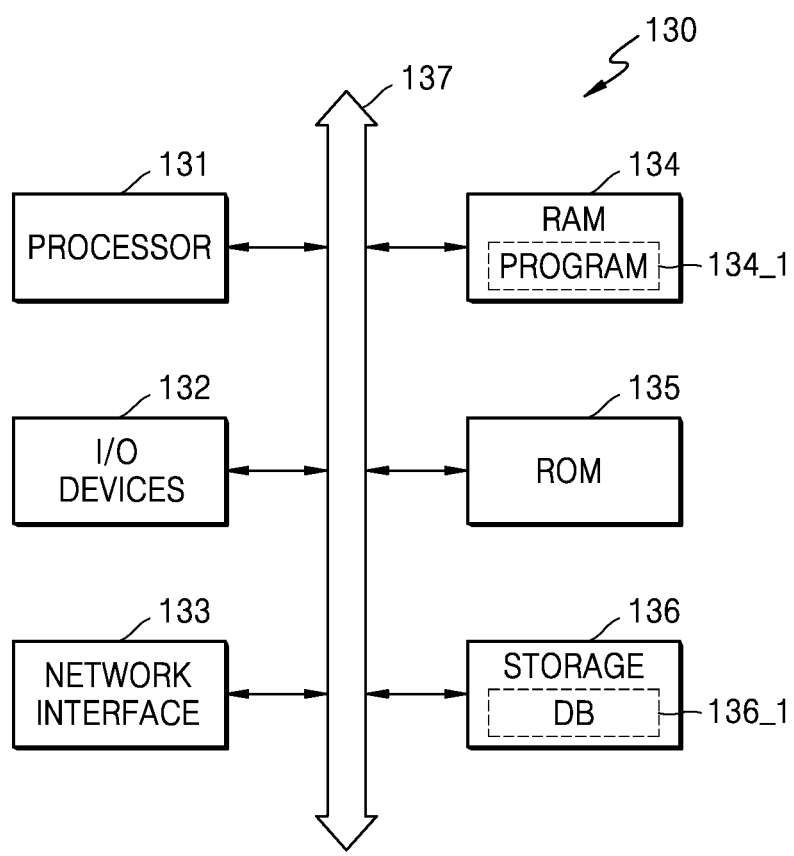
FIG. 14 is a block diagram of a computing system including a memory storing a program, according to an example embodiment.

FIG. 14 is a block diagram of the computing system 130 including a memory storing a program, according to an example embodiment. At least some of operations included in a method of fabricating an integrated circuit (for example, the method of FIG. 11) and included in a method of designing an integrated circuit (for example, the method of FIG. 12), according to example embodiments, may be performed by the computing system 130.

The computing system 130 may be a fixed computing system such as a desktop computer, a workstation, or a server, or may be a portable computing system such as a laptop computer. As shown in FIG. 14, the computing system 130 may include a processor 131, input/output (I/O) devices 132, a network interface 133, RAM 134, ROM 135, and a storage 136. The processor 131, the I/O devices 132, the network interface 133, the RAM 134, the ROM 135, and the storage 136 may be connected to a bus 137 and communicate with each other through the bus 137.

The processor 131 may be referred to as a processing unit, and may include at least one core capable of executing an arbitrary instruction set (for example, Intel architecture-32 (IA-32), 64-bit extended IA-32, x86-64, PowerPC, Sparc, MIPS, ARM, or IA-64), such as a microprocessor, an application processor (AP), a digital signal processor (DSP), or a GPU. For example, the processor 131 may access a memory, i.e., the RAM 134 or ROM 135, via the bus 137, and execute instructions stored in the RAM 134 or ROM 135.

The RAM 134 may store a program 134_1 for fabricating an integrated circuit according to an example embodiment or at least a part of the program 134_1, and the program 134_1 may enable the processor 131 to perform at least some of the operations included in the method of fabricating the integrated circuit (for example, the method of FIG. 11) and included in the method of designing the integrated circuit (for example, the method of FIG. 12). In other words, the program 134_1 may include a plurality of instructions executable by the processor 131, and the plurality of instructions included in the program 134_1 may enable the processor 131 to perform at least some of the operations included in, for example, the flowchart described with reference to FIGS. 11 and 12.

The storage 136 may not lose stored data even when power supplied to the computing system 130 is cut off. For example, the storage 136 may include a non-volatile memory device or may include a storage medium such as a magnetic tape, an optical disk, or a magnetic disk. Also, the storage 136 may be detached from the computing system 130. The storage 136 may store the program 134_1 according to an example embodiment, and the program 134_1 or at least a part of the program 134_1 may be loaded to the RAM 134 from the storage 136 before the program 134_1 is executed by the processor 131. Alternatively, the storage 136 may store a file prepared in a program language, and the program 134_1 generated by a compiler or the like or at least a part of the program 134_1 may be loaded to the RAM 134 from the file. Also, as shown in FIG. 14, the storage 136 may store a database 136_1, and the database 136_1 may include information required to design the integrated circuit, for example, the cell library D12 of FIG. 12.

The storage 136 may store data processed or to be processed by the processor 131. In other words, according to the program 134_1, the processor 131 may generate data by processing data stored in the storage 136 or may store generated data in the storage 136. For example, the storage 136 may store the RTL data D11, the netlist data D13, and/or the layout data D14 of FIG. 11.

The I/O devices 132 may include an input device such as a keyboard, a pointing device, or the like, and may include an output device such as a display device, a printer, or the like. For example, via the I/O devices 132, a user may trigger execution of the program 134_1 by the processor 131, input the RTL data D11 and/or the netlist data D13 of FIG. 11, or identify the layout data D14 of FIG. 11.

The network interface 133 may provide access to a network outside the computing system 130. For example, the network may include a plurality of computing systems and communication links, and the communication links may include wired links, optical links, wireless links, or other types of links.

While example embodiments have been particularly shown and described, it will be understood that various changes in form and details may be made therein without departing from the spirit and scope of the following claims.

What is claimed is:

1. An integrated circuit comprising:
    a first cell that has a first height and is arranged in a first row which extends in a first direction;
    a second cell that has a second height and is arranged in a second row which extends in the first direction and is adjacent to the first row, wherein the second cell is adjacent to the first cell in a second direction perpendicular to the first direction; and
    a power line that extends in the first direction, is arranged on a boundary between the first cell and the second cell, and is configured to supply power to the first cell and the second cell,
    wherein the first cell overlaps a first width of the power line along the second direction and the second cell overlaps a second width of the power line along the second direction, and
    wherein the first width and the second width are different from each other.

2. The integrated circuit of claim 1, wherein the first height is greater than the second height, and the first width is greater than the second width.

3. The integrated circuit of claim 1, wherein the first cell comprises at least one first conductive pattern formed in a first wiring layer and arranged on a plurality of first tracks which extend in the first direction,
    wherein the second cell comprises at least one second conductive pattern formed in the first wiring layer and arranged on a plurality of second tracks which extend in the first direction,
    wherein a first quantity of the plurality of first tracks is greater than a second quantity of the plurality of second tracks, and
    wherein the first width is greater than the second width.

4. The integrated circuit of claim 3, wherein an interval between the plurality of first tracks is a first interval,
    wherein an interval between the plurality of second tracks is a second interval,
    wherein an interval between the power line and a first adjacent track closest to the power line from among the plurality of first tracks is greater than the first interval, and
    wherein an interval between the power line and a second adjacent track closest to the power line from among the plurality of second tracks is greater than the second interval.

5. The integrated circuit of claim 3, wherein the power line is arranged on the first wiring layer,
    wherein the integrated circuit further comprises an upper power line which is connected to the power line, extends in the first direction, and is arranged on a third wiring layer,
    wherein the third wiring layer is arranged on the first wiring layer, and
    wherein a width of the upper power line is asymmetric based on the boundary.

6. The integrated circuit of claim 1, wherein the first cell comprises a plurality of first gate electrodes which extend in the second direction,
    wherein the second cell comprises a plurality of second gate electrodes which extend in the second direction, and
    wherein a first pitch between the plurality of first gate electrodes corresponds to a second pitch between the plurality of second gate electrodes.

7. The integrated circuit of claim 6, wherein a cutting region is arranged below the power line between the plurality of first gate electrodes and the plurality of second gate electrodes, and
    wherein a center of the cutting region passes through by the boundary.

8. The integrated circuit of claim 6, wherein the first cell comprises a plurality of first active patterns which extend in the first direction and connect to at least one of the plurality of first gate electrodes to form a transistor,
    wherein the second cell comprises a plurality of second active patterns which extend in the first direction and connect to at least one of the plurality of second gate electrodes,
    wherein a first quantity of the plurality of first active patterns is greater than a second quantity of the plurality of second active patterns, and
    wherein the first width is greater than the second width.

9. The integrated circuit of claim 1, further comprising a dummy pattern which extends in the first direction below the power line, and
    wherein the boundary is located along the dummy pattern.

10. The integrated circuit of claim 1, further comprising a via connected to the power line in a vertical direction and electrically connected to the power line, the first cell and the second cell,
    wherein a center of the via passes through by the boundary in the first direction.

11. The integrated circuit of claim 1, further comprising:
    a plurality of first cells, each of which has the first height and is arranged on M first rows adjacent to each other, wherein M is a natural number; and a plurality of second cells, each of which as the second height and is arranged on N second rows adjacent to each other, wherein N is a natural number, wherein the first cell is one of the plurality of first cells, and wherein the second cell is one of the plurality of second cells.

12. An integrated circuit comprising:

a first cell that is arranged on a first row, wherein the first row extends in a first direction and has a first height;

a second cell that is arranged on a second row, wherein the second row is adjacent to the first row and has the first height;

a third cell that is arranged on a third row, wherein the third row is adjacent to the second row and has a second height;

a first power line arranged on a first boundary where the first row and the second row contact each other, wherein the first power line is configured to provide power to the first cell and the second cell; and a second power line arranged on a second boundary where the second row and the third row contact each other, wherein the second power line is configured to provide power to the second cell and the third cell, wherein the first power line is symmetric based on the first boundary, and wherein the second power line is asymmetric based on the second boundary.

13. The integrated circuit of claim 12, wherein the first cell overlaps a first width of the first power line and the second cell overlaps a second width of the first power line, wherein the second cell overlaps a third width of the second power line and the third cell overlaps a fourth width of the second power line, wherein the first width, the second width and the third width have a common value, and wherein the fourth width is different from the common value.

14. The integrated circuit of claim 13, wherein the first height is greater than the second height, and wherein the common value is greater than the fourth width.

15. The integrated circuit of claim 13, wherein each of the first cell and the second cell comprises at least one first conductive pattern arranged on a plurality of first tracks which extend in the first direction and are spaced apart from each other at a first track interval, wherein the third cell comprises at least one second conductive pattern arranged on a plurality of second tracks which extend in the first direction and are spaced apart from each other at a second track interval, wherein when a first quantity of the plurality of first tracks is greater than a second quantity of the plurality of second tracks, the common value is greater than the fourth width, and wherein when the second quantity is greater than the first quantity, the fourth width is greater than the common value.

16. The integrated circuit of claim 13, wherein the first cell, the second cell and the third cell respectively comprise a plurality of first gate electrodes, a plurality of second gate electrodes and a plurality of third gate electrodes, wherein the plurality of first gate electrodes, the plurality of second gate electrodes and the plurality of third gate electrodes extend in a second direction that crosses the first direction, and wherein pitches between the plurality of first gate electrodes, the plurality of second gate electrodes and the plurality of third gate electrodes are the same as each other.

17. The integrated circuit of claim 16, wherein each of the first cell and the second cell comprises a plurality of first active patterns which extend in the first direction and connect to at least one of the plurality of first gate electrodes and the plurality of second gate electrodes to form a transistor, wherein the third cell comprises a plurality of second active patterns which extend in the first direction and connect to at least one of the plurality of third gate electrodes to form a transistor, wherein when a first quantity of the plurality of first active patterns is greater than a second quantity of the plurality of second active patterns, wherein the common value is greater than the fourth width, and wherein when the second quantity is greater than the first quantity, the fourth width is greater than the common value.

18. A method of designing an integrated circuit, the method comprising:

arranging a plurality of first cells from a cell library on a plurality of first rows based on input data of defining the integrated circuit, wherein the plurality of first rows extend in a first direction and have a first height;

arranging a plurality of second cells from the cell library on a plurality of second rows based on the input data, wherein the plurality of second rows extend in the first direction and have a second height;

arranging a first power line having an asymmetric width with respect to a first boundary between the plurality of first rows and the plurality of second rows; and generating output data defining a layout of the integrated circuit.

19. The method of claim 18, further comprising arranging a second power line having a symmetric width with respect to a second boundary between the plurality of first rows and a third boundary between the plurality of second rows.

20. The method of claim 18, wherein the arranging of the first power line comprises:

arranging, on a first wiring layer, a first pattern configured to provide a voltage to the plurality of first cells and the plurality of second cells, wherein the first pattern extends in a second direction that crosses the first direction and has an asymmetric width; and arranging, on a second wiring layer provided above the first wiring layer, a second pattern configured to provide the voltage to the first pattern, wherein the second pattern extends in the second direction and has an asymmetric width.

* * * * *